(12) United States Patent
Yamamoto et al.

(10) Patent No.: US 11,929,292 B2
(45) Date of Patent: Mar. 12, 2024

(54) SEMICONDUCTOR MEMORY AND METHOD OF MANUFACTURING THE SEMICONDUCTOR MEMORY

(71) Applicant: Kioxia Corporation, Tokyo (JP)

(72) Inventors: Naoki Yamamoto, Kuwana (JP); Yu Hirotsu, Kuwana (JP)

(73) Assignee: Kioxia Corporation, Tokyo (JP)

( * ) Notice: Subject to any disclaimer, the term of this patent is extended or adjusted under 35 U.S.C. 154(b) by 60 days.

(21) Appl. No.: 17/503,947

(22) Filed: Oct. 18, 2021

(65) Prior Publication Data

US 2022/0037217 A1 Feb. 3, 2022

Related U.S. Application Data

(63) Continuation of application No. 16/270,635, filed on Feb. 8, 2019, now Pat. No. 11,177,185.

(30) Foreign Application Priority Data

Jul. 23, 2018 (JP) .................. 2018-137888

(51) Int. Cl.
| | | |
|---|---|---|
| H01L 21/66 | (2006.01) | |
| H01L 21/768 | (2006.01) | |
| H10B 43/10 | (2023.01) | |
| H10B 43/27 | (2023.01) | |
| H10B 43/50 | (2023.01) | |

(52) U.S. Cl.
CPC ........ *H01L 22/30* (2013.01); *H01L 21/76816* (2013.01); *H01L 22/12* (2013.01); *H10B 43/10* (2023.02); *H10B 43/27* (2023.02); *H10B 43/50* (2023.02)

(58) Field of Classification Search
CPC .......... H01L 21/0243; H01L 21/02458; H01L 21/02494; H01L 21/0254; H01L 31/0304; H01L 33/007; H01L 33/24; H01L 21/02609; H01L 29/861; H01L 27/0814; H01L 29/045; H01L 29/2003; H01L 33/12; H01L 33/16; H01L 33/08; H01L 23/562; Y02E 10/544; H10B 41/10; H10B 43/50; H10B 41/27; H10B 43/10; H10B 43/27
See application file for complete search history.

(56) References Cited

U.S. PATENT DOCUMENTS

| | | |
|---|---|---|
| 8,492,824 B2 | 7/2013 | Yahashi |
| 9,589,981 B2 | 3/2017 | Nishikawa et al. |
| 2009/0267128 A1 | 10/2009 | Maejima |
| 2009/0268522 A1 | 10/2009 | Maejima |
| 2010/0207195 A1 | 8/2010 | Fukuzumi et al. |

(Continued)

*Primary Examiner* — Brian Turner
(74) *Attorney, Agent, or Firm* — Oblon, McClelland, Maier & Neustadt, L.L.P.

(57) ABSTRACT

A semiconductor memory according to an embodiment includes first and second areas, an active region, a non-active region, a first stacked body, a plurality of first pillars, a first contact, a second stacked body, and a second contact. The active region includes part of each of the first and second areas. The non-active region includes part of each of the first and second areas. The second stacked body is in the non-active region. The second stacked body includes second insulators and second conductors which are alternately stacked. A second contact is in contact with a second conductor in a first interconnect layer and a second conductor in a second interconnect layer.

19 Claims, 36 Drawing Sheets

(56) References Cited

U.S. PATENT DOCUMENTS

| | | | |
|---|---|---|---|
| 2011/0156132 A1* | 6/2011 | Kiyotoshi | H10B 43/50 257/326 |
| 2011/0284946 A1 | 11/2011 | Kiyotoshi | |
| 2016/0013129 A1 | 1/2016 | Soh | |
| 2016/0079185 A1 | 3/2016 | Kato | |
| 2016/0118399 A1* | 4/2016 | Son | G11C 16/0483 257/314 |
| 2016/0293539 A1 | 10/2016 | Park | |
| 2017/0098658 A1* | 4/2017 | Matsuda | H10B 43/50 |
| 2017/0236830 A1 | 8/2017 | Inatsuka | |
| 2017/0263618 A1 | 9/2017 | Shimojo | |
| 2018/0261616 A1 | 9/2018 | Cho | |
| 2018/0294274 A1* | 10/2018 | Lee | H10B 43/10 |
| 2020/0027893 A1 | 1/2020 | Yang et al. | |

\* cited by examiner

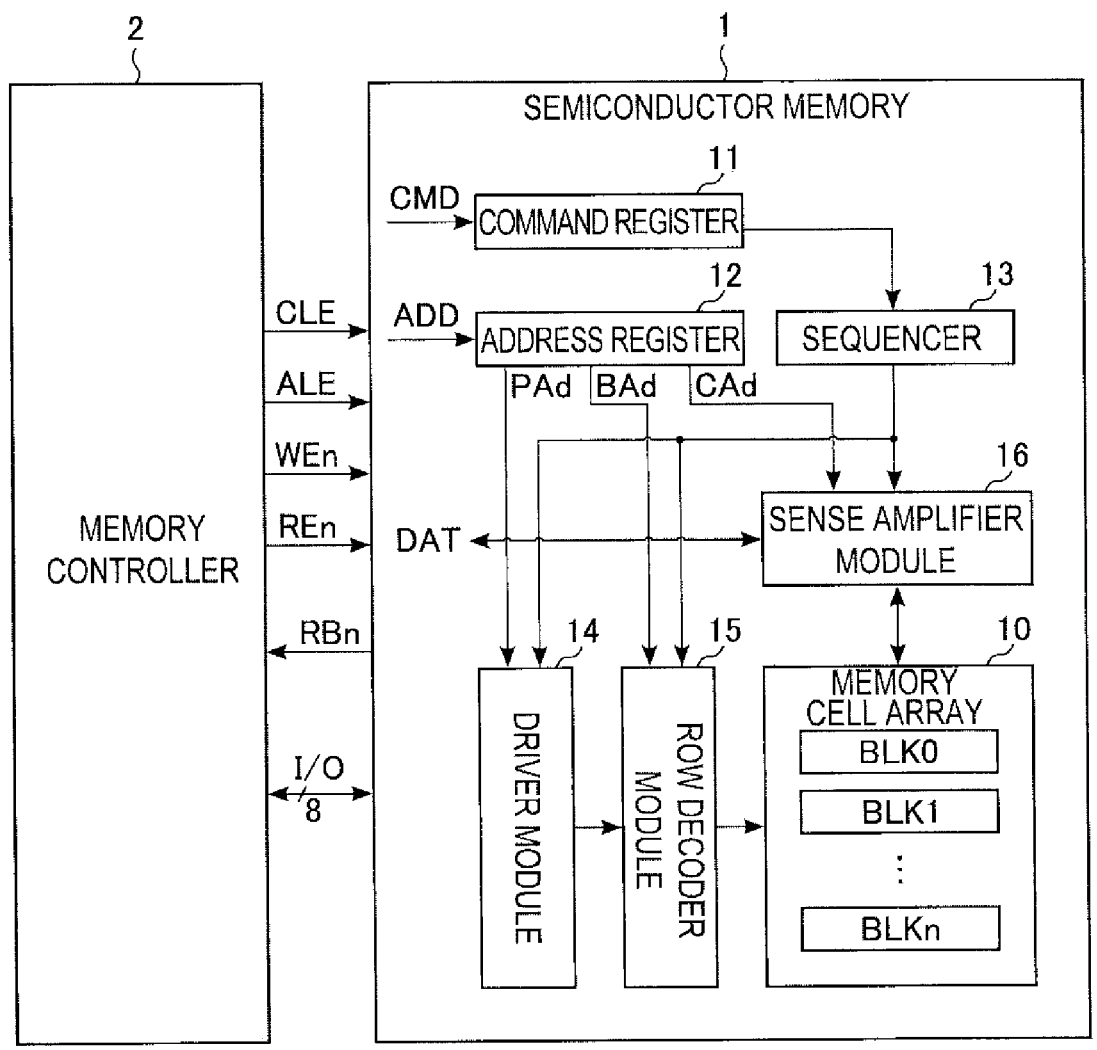
F I G. 1

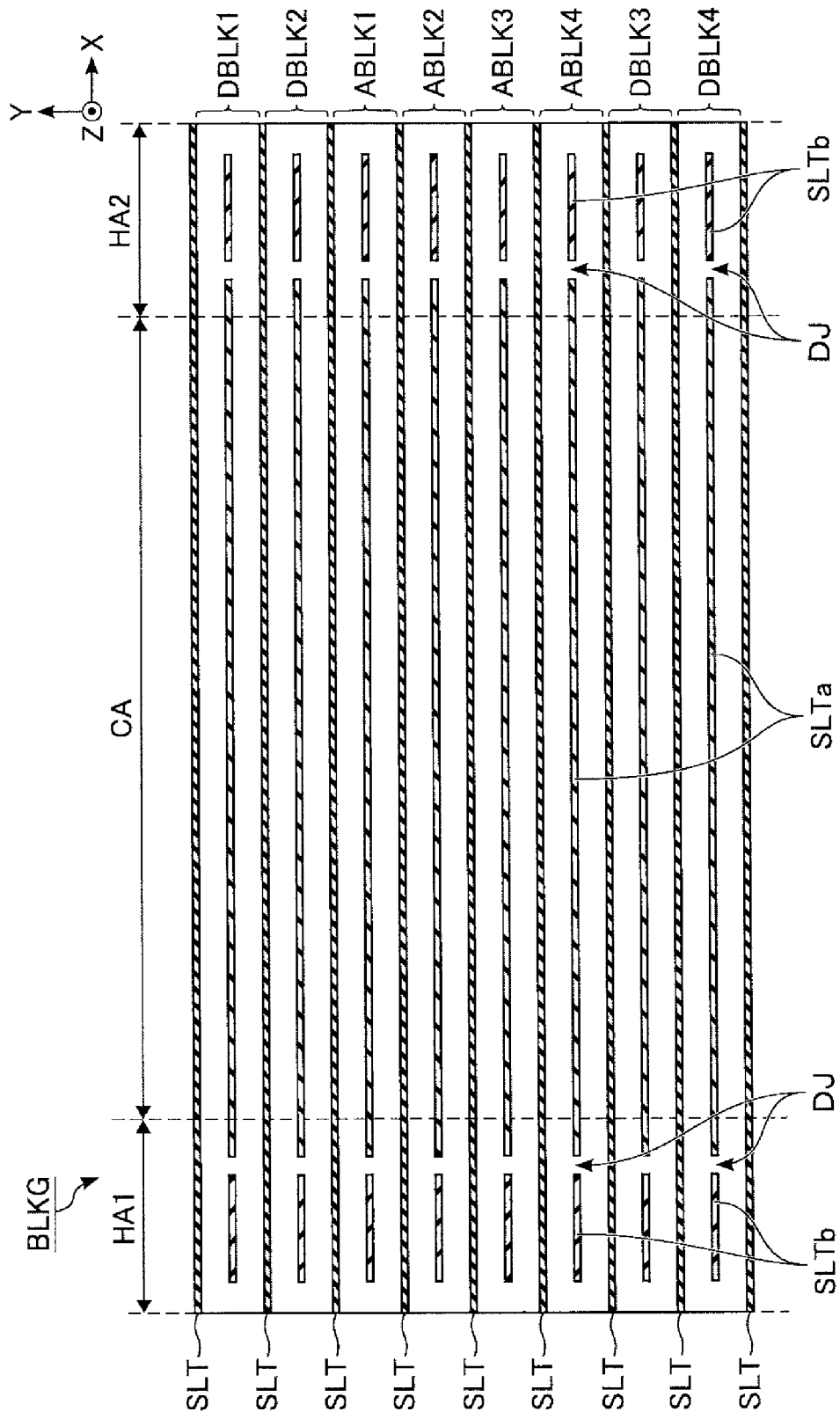
F I G. 4

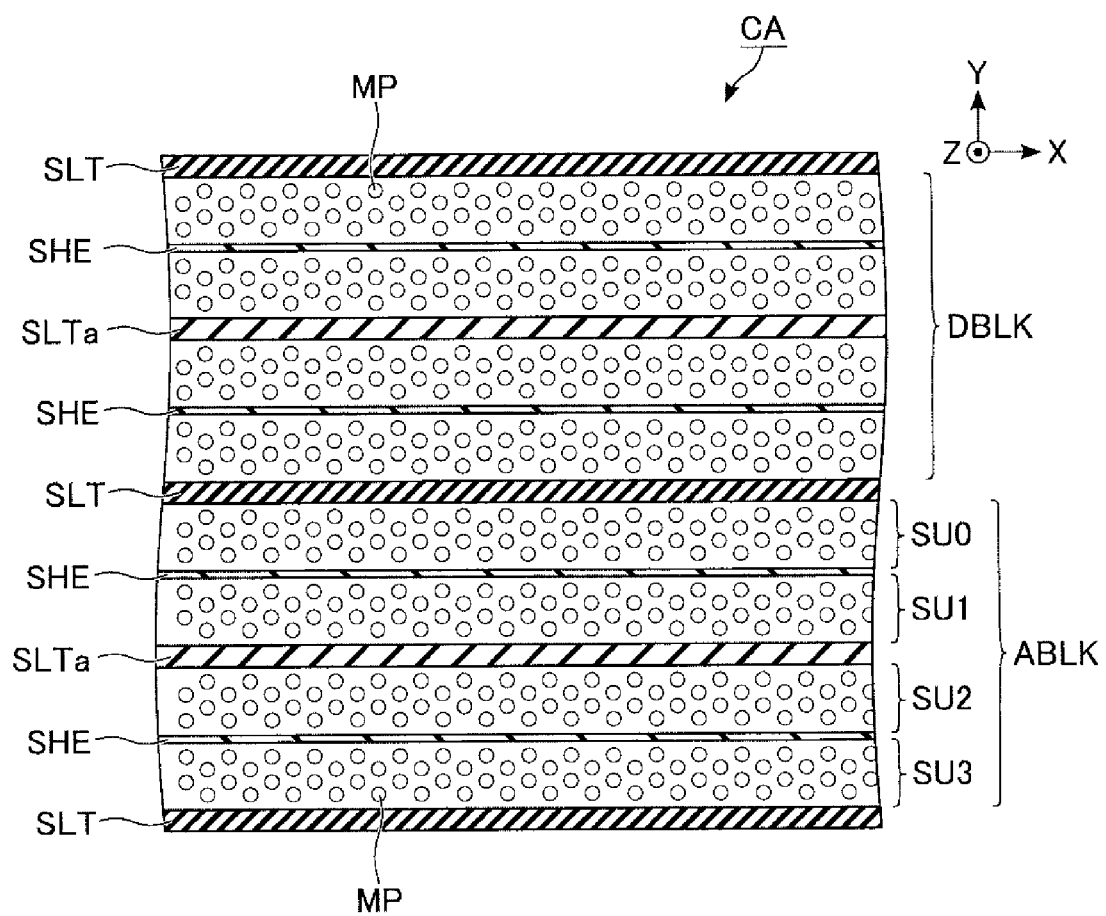
F I G. 5

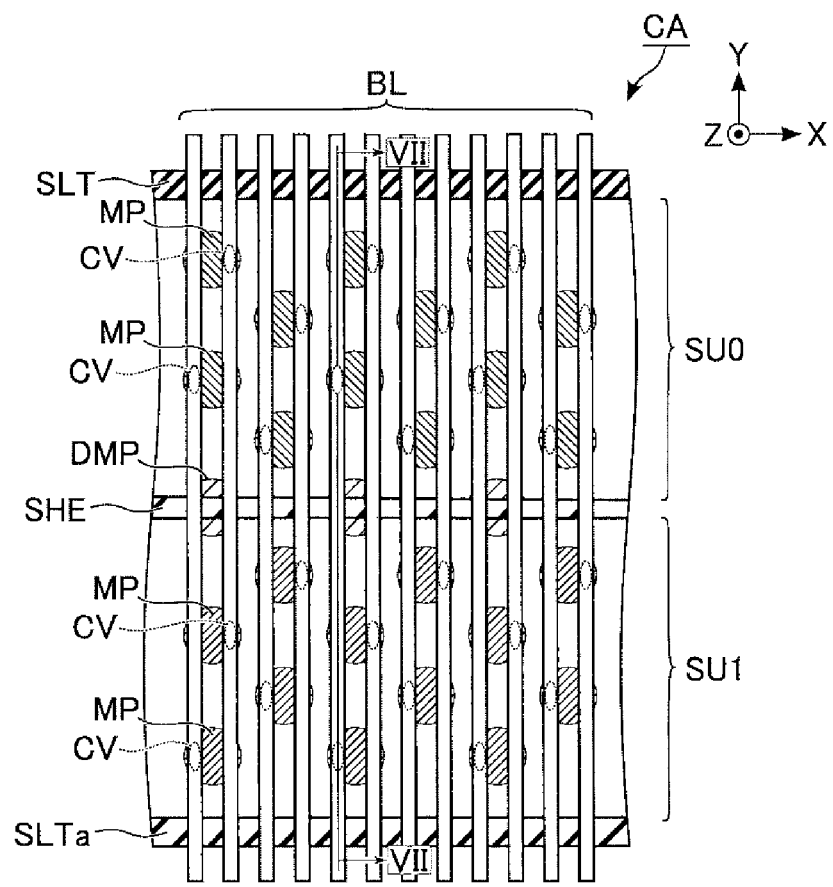
F I G. 6

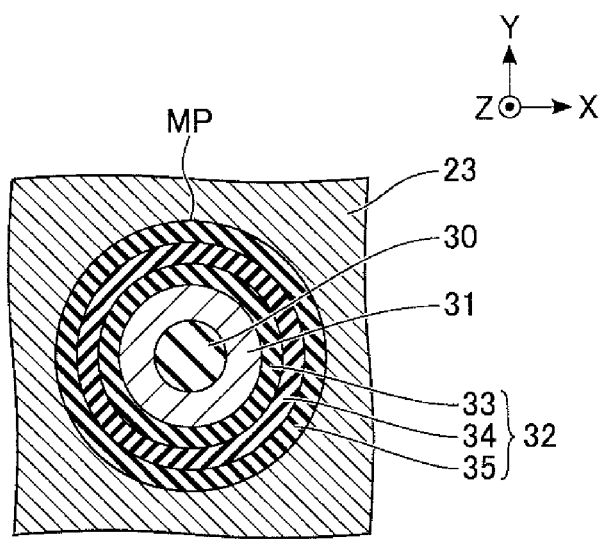
F I G. 8

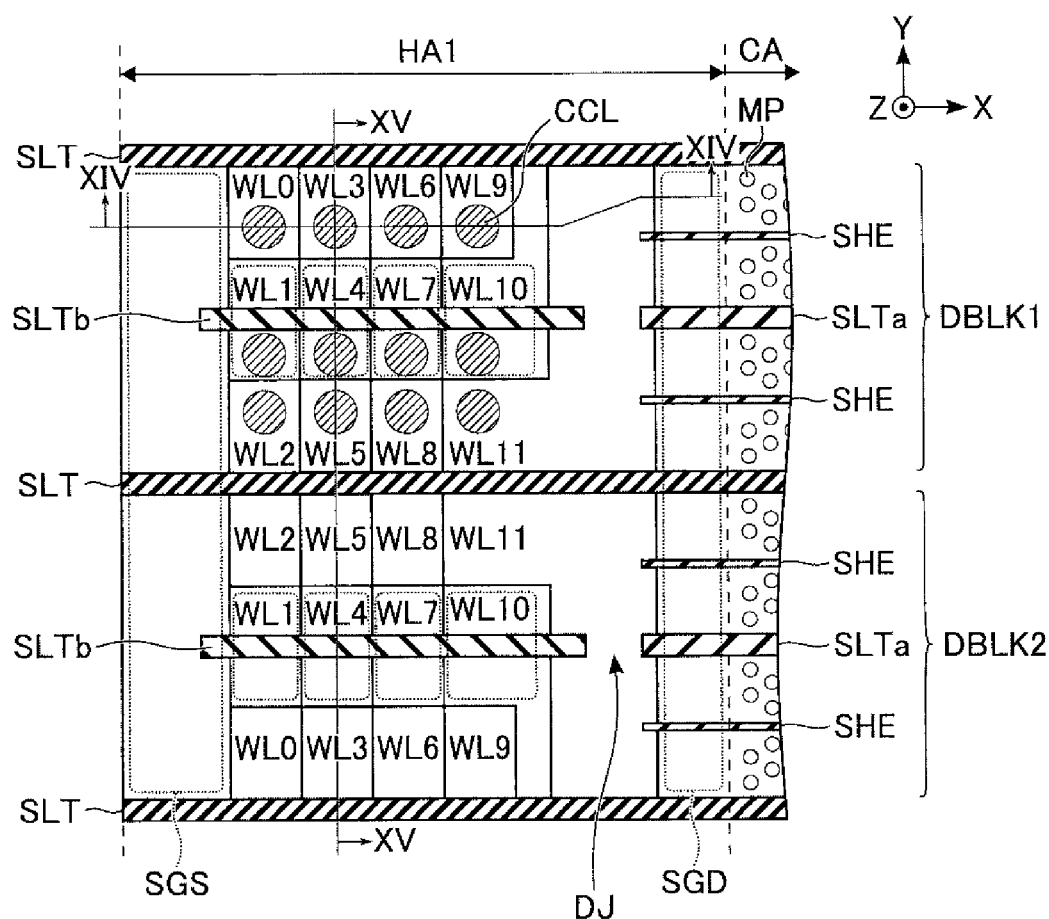
F I G. 13

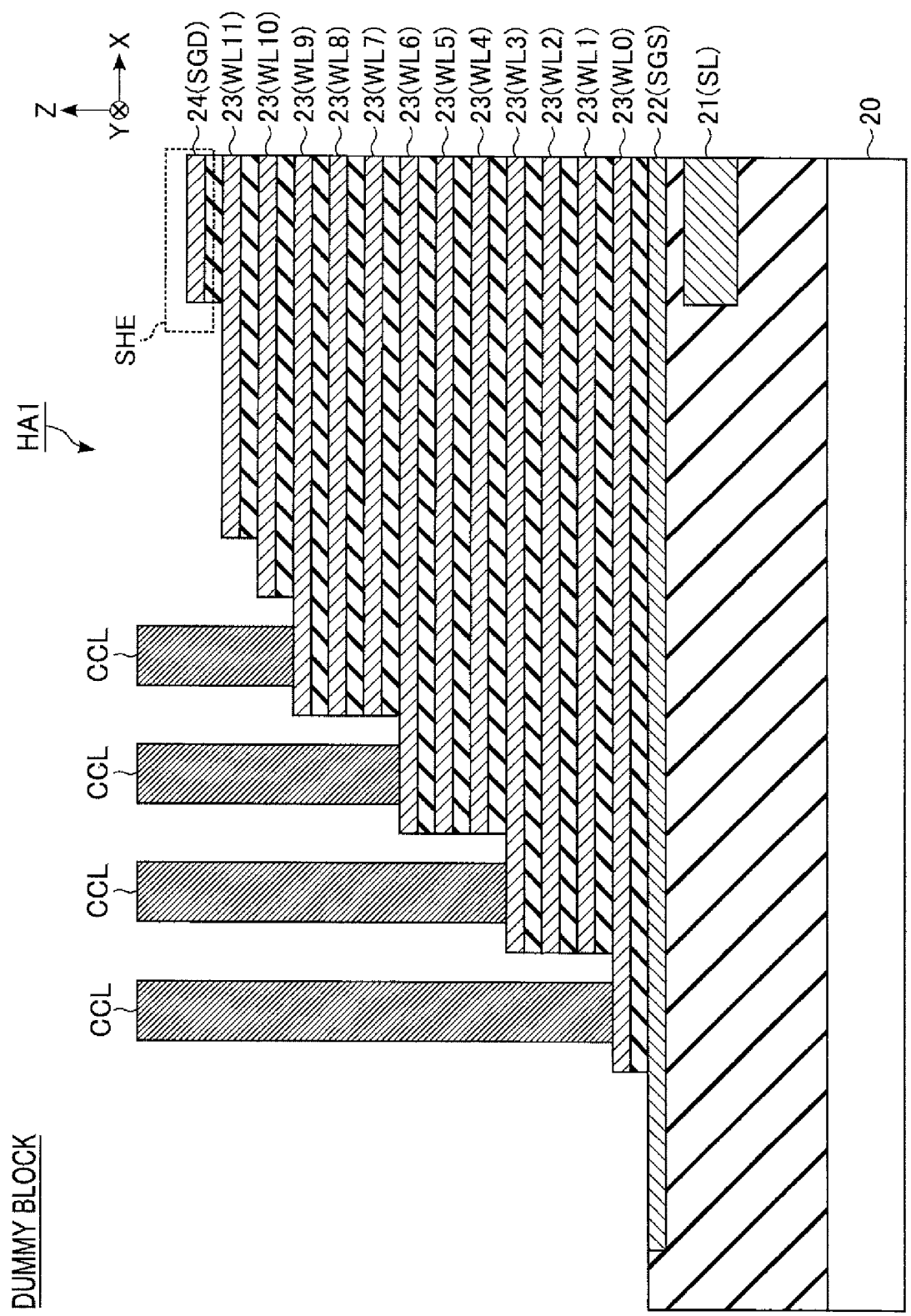
F I G. 14

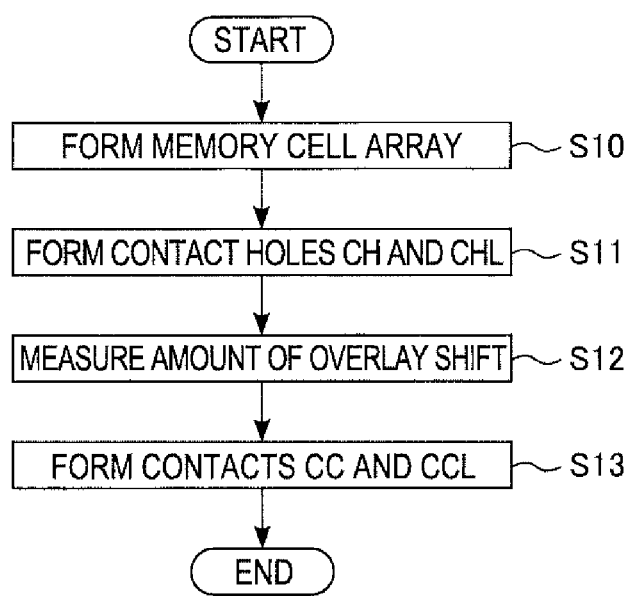
F I G. 16

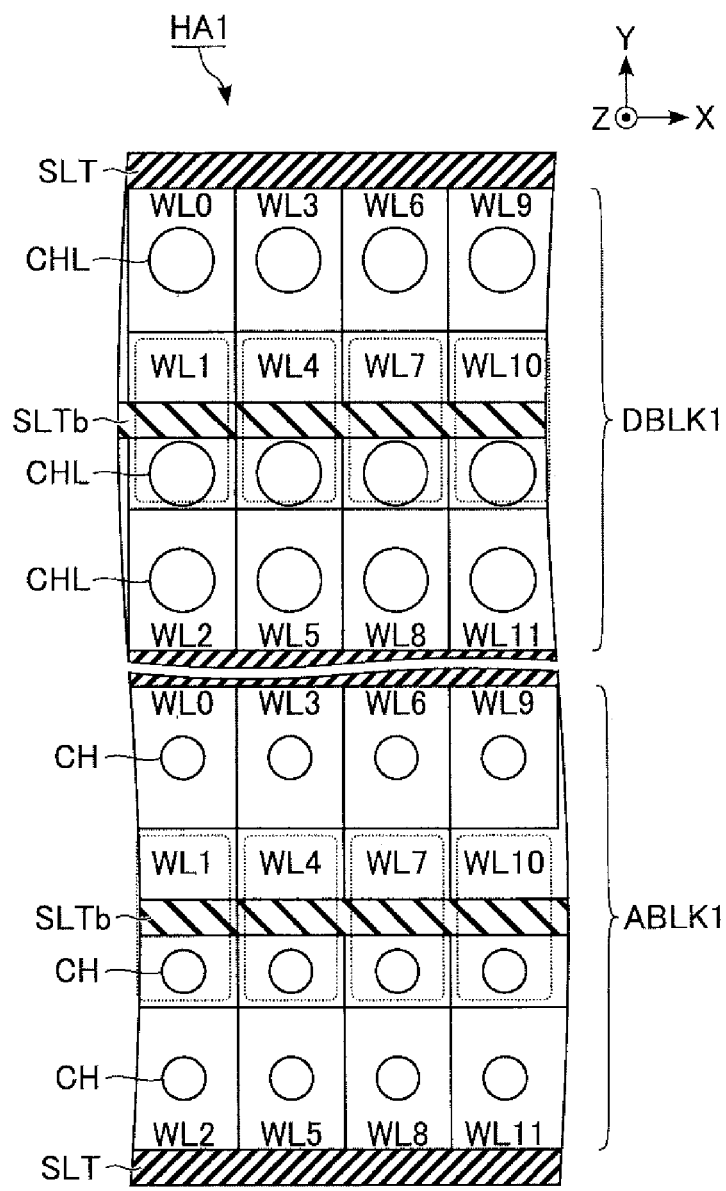
F I G. 18

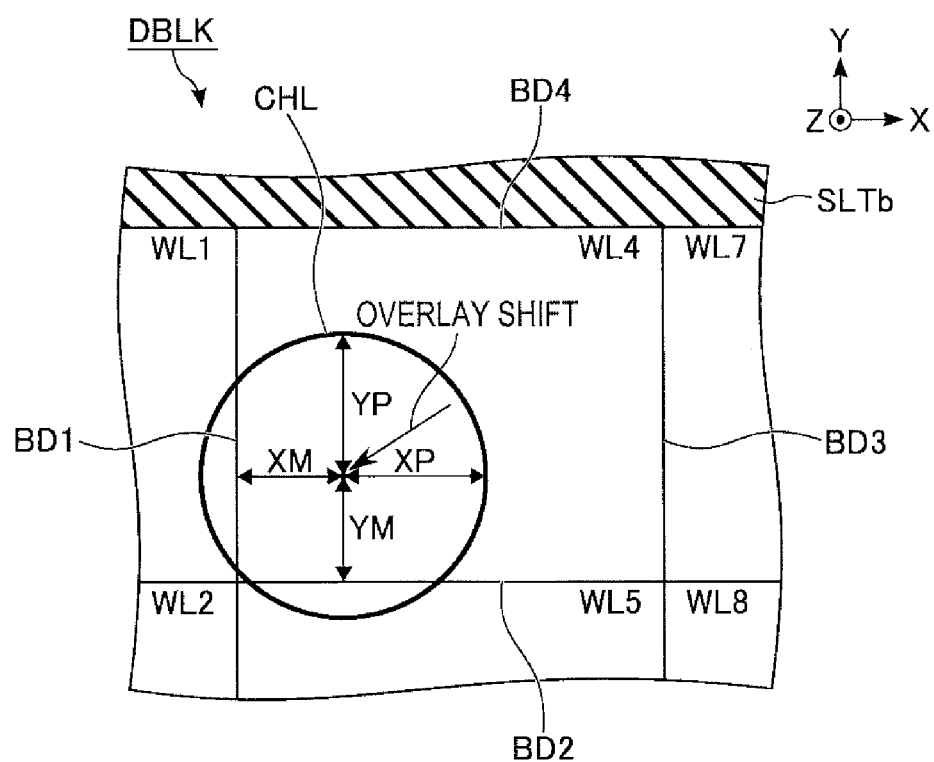
F I G. 24

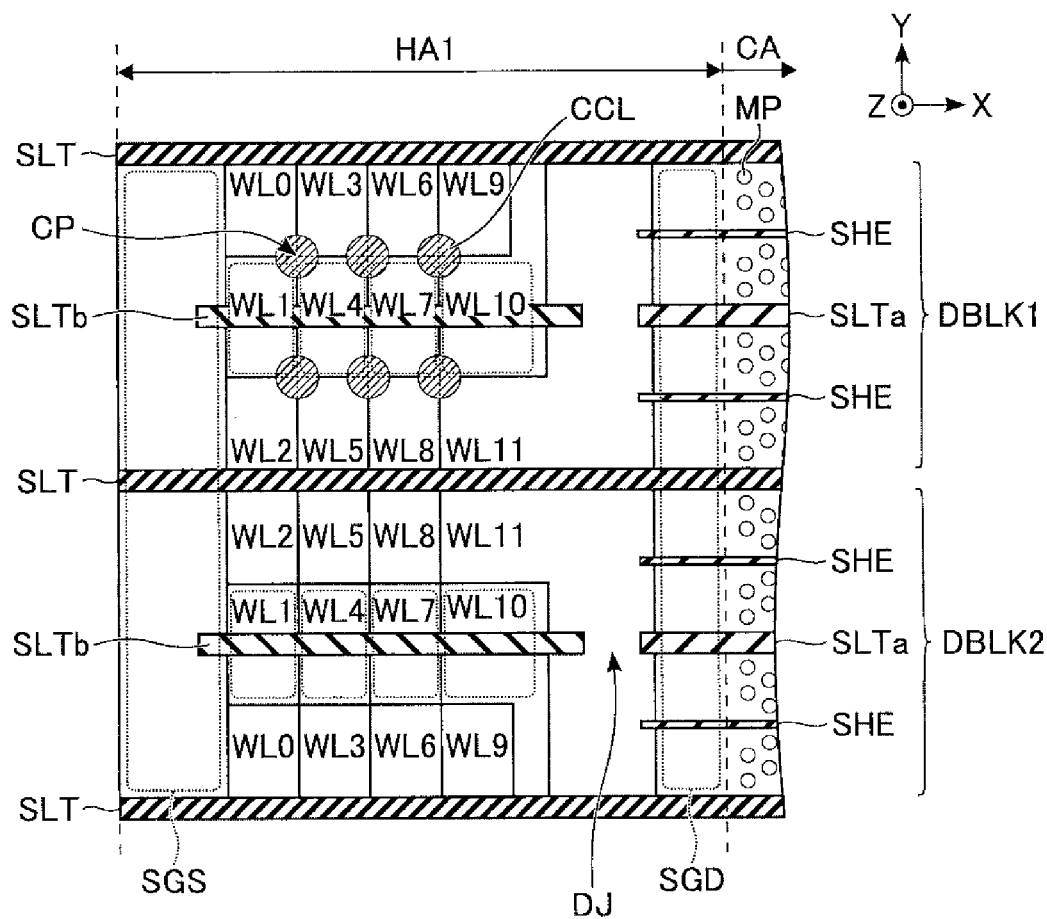
F I G. 28

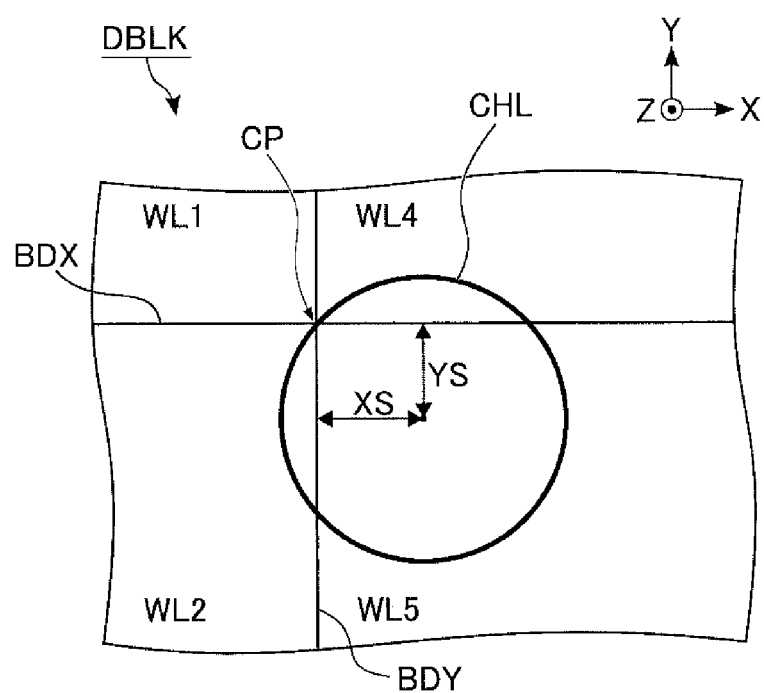
F I G. 31

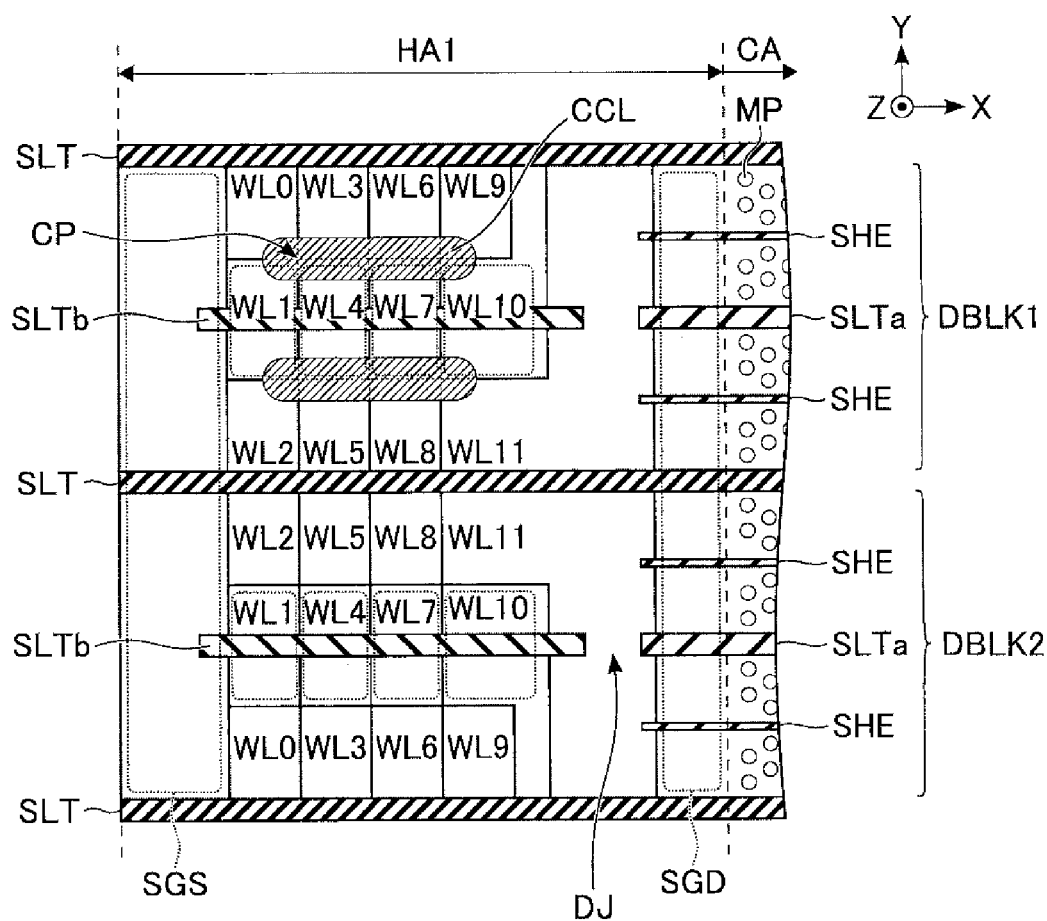
F I G. 32

SEMICONDUCTOR MEMORY AND METHOD OF MANUFACTURING THE SEMICONDUCTOR MEMORY

CROSS-REFERENCE TO RELATED APPLICATION

This application is a Continuation of U.S. application Ser. No. 16/270,635 filed Feb. 8, 2019, which is based upon and claims the benefit of priority from Japanese Patent Application No. 2018-137888, filed Jul. 23, 2018, the entire contents of each of which are incorporated herein by reference.

FIELD

An embodiment described herein relates generally to a semiconductor memory and a method of manufacturing the semiconductor memory.

BACKGROUND

NAND flash memories capable of storing data nonvolatilely are known.

BRIEF DESCRIPTION OF THE DRAWINGS

FIG. 1 is a block diagram showing an example of a configuration of a semiconductor memory according to an embodiment.

FIG. 4 is a plan view showing an example of a more detailed planar layout of the memory cell array included in the semiconductor memory according to the embodiment.

FIG. 5 is a plan view showing an example of a planar layout in a cell area of the memory cell array included in the semiconductor memory according to the embodiment.

FIG. 6 is a plan view showing an example of a more detailed planar layout in the cell area of the memory cell array included in the semiconductor memory according to the embodiment.

FIG. 8 is a sectional view showing an example of a sectional configuration of a memory pillar in the semiconductor memory according to the embodiment.

FIG. 13 is a plan view showing an example of the planar layout in the hookup area of the memory cell array included in the semiconductor memory according to the embodiment.

FIGS. 14 and 15 are sectional views showing an example of the sectional configuration in the hookup area of the memory cell array included in the semiconductor memory according to the embodiment.

FIG. 16 is a flowchart showing an example of a method of manufacturing the semiconductor memory according to the embodiment.

FIG. 18 is a plan view in the hookup area of the memory cell array, showing an example of the process of manufacturing the semiconductor memory according to the embodiment.

FIG. 24 is a plan view in the hookup area of the memory cell array, showing an example of a method of measuring an amount of overlay shift in the process of manufacturing the semiconductor memory according to the embodiment.

FIG. 28 is a plan view showing an example of a planar layout in a hookup area of a memory cell array included in a semiconductor memory according to a first modification to the embodiment.

FIG. 31 is a plan view in the hookup area of the memory cell array, showing an example of a method of measuring an amount of overlay shift in the second modification to the embodiment.

FIG. 32 is a plan view showing an example of a planar layout in a hookup area of a memory cell array included in a semiconductor memory according to a third modification to the embodiment.

DETAILED DESCRIPTION

Figure 2:
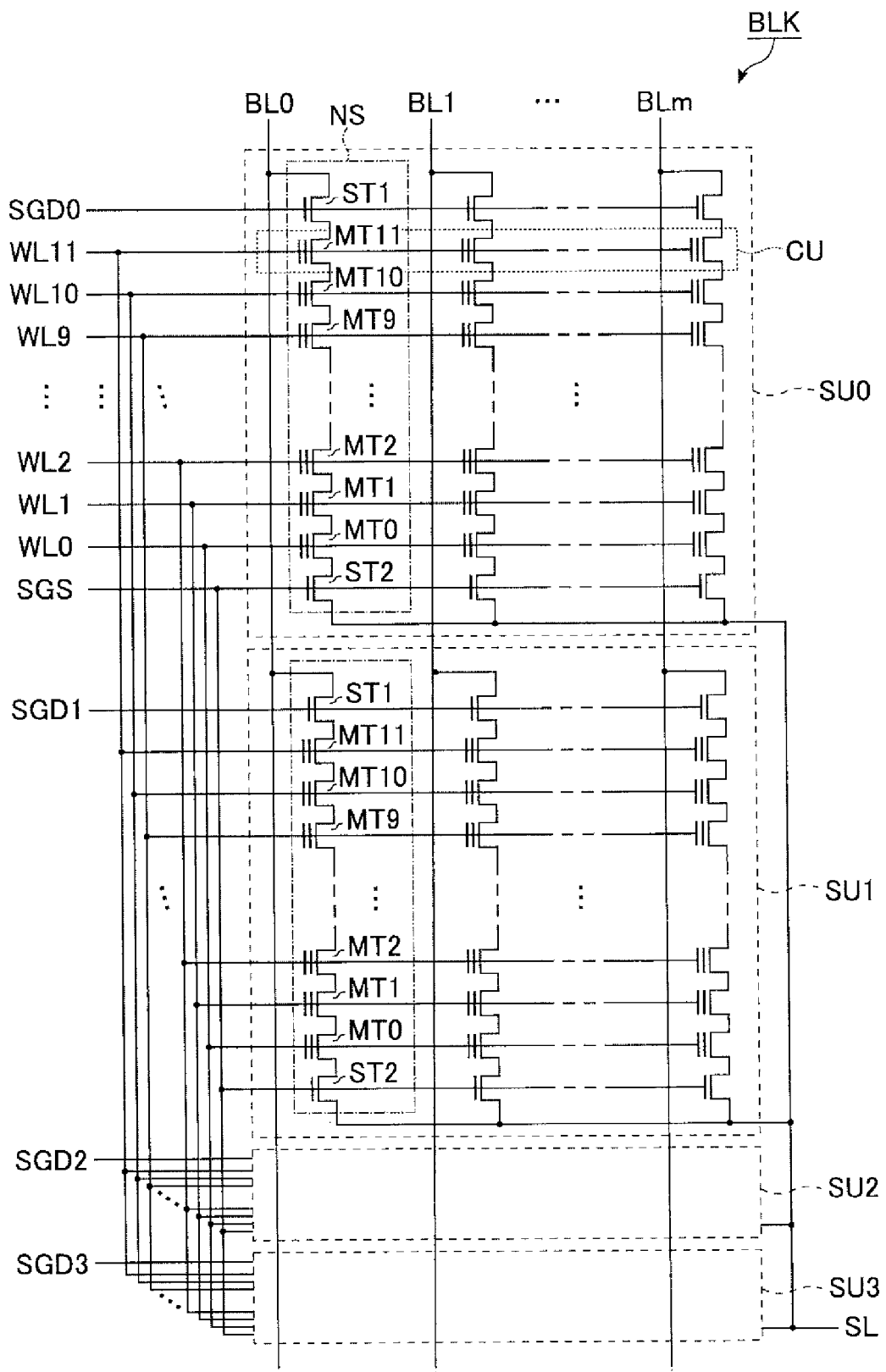
FIG. 2 is a circuit diagram showing an example of a circuit configuration of a memory cell array included in the semiconductor memory according to the embodiment.

A semiconductor memory according to an embodiment includes first and second areas, an active region, a non-active region, a first stacked body, a plurality of first pillars, a first contact, a second stacked body, and a second contact. The first and second areas are arranged in a first direction. The active region includes part of each of the first and second areas. The non-active region includes part of each of the first and second areas. The first stacked body is in the active region. The first stacked body includes first insulators and first conductors which are alternately stacked. Each of the first conductors includes a terraced portion that does not overlap the upper first conductor in the second area. The plurality of first pillars each penetrates the first stacked body in the first area. The intersection between the first pillar and the first conductor functions as a memory cell. The first contact is provided on a terraced portion of a first conductor in a first interconnect layer. The second stacked body is in the non-active region. The second stacked body includes second insulators and second conductors which are alternately stacked. Each of the second conductors includes a terraced portion that does not overlap the upper second conductor in the second area. The second contact is in contact with a second conductor in the first interconnect layer and a second conductor in a second interconnect layer different from the first interconnect layer.

The embodiment will be described below with reference to the accompanying drawings. The embodiment is directed to an example of a device and a method for embodying the technical concept of the invention. The drawings are schematic or conceptual, and none of the dimensions, ratio, etc. in each of the drawings is necessarily the same as the actual one. The technical concept of the invention is not limited by the shape, configuration, placement, etc. of the structural elements.

In the following descriptions, the structural elements having substantially the same function and configuration are denoted by the same numeral or sign. The number subsequent to a letter or letters in a reference sign is used to distinguish structural elements referred to by reference signs including the same letter or letters and having the same configuration. If the structural elements denoted by the reference signs including the same letter or letters need not be distinguished from each other, they include only the same letter or letters and not a number subsequent thereto.

[1] Embodiment

Below are descriptions of a semiconductor memory 1 according to an embodiment.

[1-1] Configuration of Semiconductor Memory 1

[1-1-1] Overall Configuration of Semiconductor Memory 1

The semiconductor memory 1 is, for example, a NAND flash memory capable of storing data nonvolatilely. The semiconductor memory 1 is controlled by, for example, an external memory controller 2. FIG. 1 shows an example of a configuration of the semiconductor memory 1 according to the embodiment.

As shown in FIG. 1, the semiconductor memory 1 includes, for example, a memory cell array 10, a command register 11, an address register 12, a sequencer 13, a driver module 14, a row decoder module 15 and a sense amplifier module 16.

The memory cell array 10 includes a plurality of blocks BLK0 to BLKn (n is an integer of 1 or more). The block BLK is a set of memory cells capable of storing data nonvolatilely and is used as, for example, a unit of data erase.

The memory cell array 10 also includes a plurality of bit lines and a plurality of word lines. Each memory cell of the memory cell array 10 is associated with, for example, its corresponding one of the bit lines and its corresponding one of the word lines. The configuration of the memory cell array 10 will be described in detail later.

The command register 11 holds a command CMD which the semiconductor memory 1 has received from the memory controller 2. The command CMD includes, for example, instructions to cause the sequencer 13 to perform a read operation, a write operation, an erase operation and the like.

The address register 12 holds address information ADD which the semiconductor memory 1 has received from the memory controller 2. The address information ADD includes a block address BAd, a page address PAd, a column address CAd and the like. For example, the block address BAd, page address PAd and column address CAd are used to select a block BLK, a word line and a bit line, respectively.

The sequencer 13 controls the operation of the entire semiconductor memory 1. For example, the sequencer 13 controls the driver module 14, the row decoder module 15, the sense amplifier module 16 and the like based on the command CMD held in the command register 11 to perform a read operation, a write operation, an erase operation and the like.

The driver module 14 generates a voltage to be used in the read operation, write operation, erase operation and the like. Then, the driver module 14 applies the generated voltage to a signal line corresponding to a selected word line, for example, based on the page address PAd held in the address register 12.

The row decoder module 15 selects one block BLK in the memory cell array 10, based on the block address BAd held in the address register 12. Then, the row decoder module 15 transfers, for example, a voltage applied to the signal line corresponding to the selected word line, to the selected word line in the selected block BLK.

In the write operation, the sense amplifier module 16 apples a desired voltage to each bit line in accordance with write data DAT received from the memory controller 2. In the read operation, the sense amplifier module 16 determines data stored in a memory cell based on the voltage of the bit line, and transfers a result of the determination to the memory controller 2 as read data DAT.

Communications between the semiconductor memory 1 and the memory controller 2 supports, for example, the NAND interface standard. In the communications, for example, a command latch enable signal CLE, an address latch enable signal ALE, a write enable signal WEn, a read enable signal REn, a ready busy signal RBn and an input/output signal I/O are used.

The command latch enable signal CLE is a signal indicating that the input/output signal I/O received by the semiconductor memory 1 is the command CMD. The address latch enable signal ALE is a signal indicating that the signal I/O received by the semiconductor memory 1 is the address information ADD. The write enable signal WEn is a signal to instruct the semiconductor memory 1 to receive the input/output signal I/O. The read enable signal REn is a signal to instruct the semiconductor memory 1 to output the input/output signal I/O.

The ready busy signal RBn is a signal to notify the memory controller 2 whether the semiconductor memory 1 is in a ready state to accept the instruction from the memory controller 2 or in a busy state not to accept the instruction. The input/output signal I/O is, for example, an 8-bit wide signal and may include a command CMD, address information ADD, data DAT and the like.

The semiconductor memory 1 and the memory controller 2 described above may be combined to compose one semiconductor device. As this semiconductor device, there are a memory card such as SD™ card, a solid-state drive (SSD) and the like.

[1-1-2] Circuit Configuration of Memory Cell Array 10

FIG. 2 shows an example of a circuit configuration of the memory cell array 10 included in the semiconductor memory 1 according to the embodiment, extracting one of the blocks BLK included in the memory cell array 10.

As shown in FIG. 2, the block BLK includes, for example, four string units SU0 to SU3. Each string unit SU includes a plurality of NAND strings NS.

The NAND strings NS are associated with their respective bit lines BL0 to BLm (m is an integer of one or more). Each NAND string NS includes, for example, memory cell transistors MT0 to MT11 and select transistors ST1 and ST2.

Each memory cell transistor MT includes a control gate and a charge accumulation layer and holds data nonvolatilely. Each of the select transistors ST1 and ST2 is used to select the string unit SU during various operations.

In each NAND string NS, the memory cell transistors MT0 to MT11 are connected in series between the select transistors ST1 and ST2. In the same block BLK, the control gates of the memory cell transistors MT0 to MT11 are commonly connected to word lines WL0 to WL11, respectively.

In each NAND string NS, the drain of a select transistor ST1 is connected to its associated bit line BL and the source thereof is connected to one end of each of the series-connected memory cell transistors MT0 to MT11. In the same block BLK, the gates of the select transistors ST1 in the string units SU0 to SU3 are commonly connected to select gate lines SGD0 to SGD3, respectively.

In each NAND string NS, the drain of a select transistor ST2 is connected to the other end of each of the series-connected memory cell transistors MT0 to MT11. In the same block BLK, the sources of the select transistors ST2 are commonly connected to a source line SL and the gates thereof are commonly connected to a select gate line SGS.

In the circuit configuration of the memory cell array 10 described above, each bit line BL is connected to, for example, the NAND strings NS corresponding to each block BLK. The source line SL is connected to, for example, the blocks BLK.

A set of memory cell transistors MT connected to a common word line WL in one string unit SU is referred to as, for example, a cell unit CU. For example, the storage capacity of the cell unit CU including memory cell transistors MT each storing one-bit data is defined as "one-page data." The cell unit CU may have a storage capacity of data of two or more pages, according to the number of bits of data to be stored in the memory cell transistor MT.

Note that the circuit configuration of the memory cell array 10 included in the semiconductor memory 1 according to the embodiment is not limited to the configuration described above. For example, the number of memory cell transistors MT and the number of select transistors ST1 and ST2, which are included in each NAND string NS, can optionally be set. The number of string units SU included in each block BLK can optionally be set.

[1-1-3] Configuration of Memory Cell Array 10

An example of the configuration of the semiconductor memory 1 according to the embodiment will be described below.

In the figures referred to below, the X direction corresponds to the extending direction of the word line WL, the Y direction corresponds to the extending direction of the bit line BL, and the Z direction corresponds to a direction perpendicular to the surface of the semiconductor substrate 20 on which the semiconductor memory 1 is formed.

In the sectional views referred to below, structural elements such as an insulating layer (an interlayer insulating film), interconnect and contacts will be omitted as appropriate for clarification. Furthermore, hatching is added to the plan views as appropriate for clarification. The hatching attached to the plan views is not necessarily related to the materials or properties of the structural elements to which hatching is added.

(Planar Layout of Memory Cell Array 10)

Figure 3:
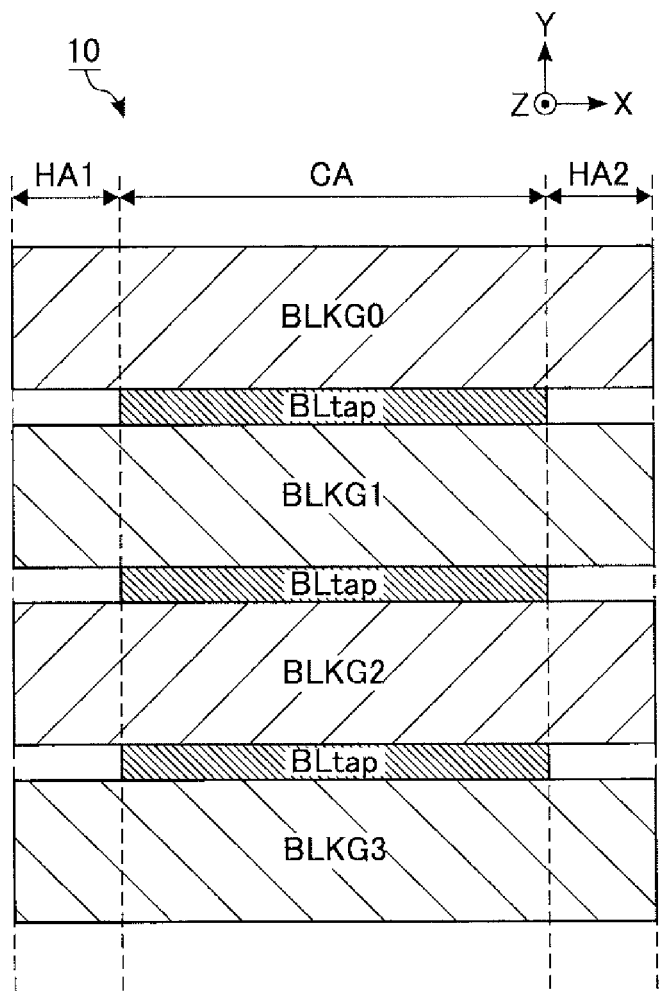
FIG. 3 is a plan view showing an example of a planar layout of the memory cell array included in the semiconductor memory according to the embodiment.

FIG. 3 shows an example of a planar layout of the memory cell array 10 in the semiconductor memory 1 according to the embodiment.

As shown in FIG. 3, the memory cell array 10 includes, for example, block groups BLKG0 to BLKG3. Each block group BLKG includes a plurality of blocks BLK. Each block group BLKG is provided to extend along the X direction, and the block groups BLKG0 to BLKG3 are arranged in the Y direction.

The region of the block group BLKG can be divided into, for example, a cell area CA and hookup areas HA1 and HA2. For example, the hookup areas HA1 and HA2 are arranged in an end portion of the block group BLKG and the other end portion thereof, respectively in the X direction. The cell area CA is placed between the hookup areas HA1 and HA2.

The cell area CA is an area in which a plurality of NAND strings NS are formed. Each of the hookup areas HA1 and HA2 is an area in which a contact for electrically connecting the select gate lined SGD and SGS and word lines WL, which are connected to the NAND string NS, and the row decoder module 15 is formed.

In the cell area CA, for example, a BL connection area BLtap is provided between adjacent block groups BLKG. The BL connection area BLtap is, for example, an area in which a contact for electrically connecting a bit line BL connected to the NAND string NS and the sense amplifier module 16 disposed under the memory cell array 10 is formed.

FIG. 4 shows an example of a more detailed planar layout of the memory cell array 10 included in the semiconductor memory 1 according to the embodiment, extracting one of the block groups BLKG.

As shown in FIG. 4, for example, the block group BLKG includes four active blocks ABLK1 to ABLK4 and four dummy blocks DBLK1 to DBLK4. The region in which the block group BLKG is provided includes, for example, a plurality of slits SLT, SLTa and SLTb.

The active blocks ABLK are blocks BLK that are used for storage of data. The total number of active blocks ABLK included in the memory cell array 10 corresponds to that of blocks BLK included in the memory cell array 10.

The dummy blocks DBLK are blocks BLK that are not used for storage of data. The dummy blocks DBLK are provided to ensure the shapes of the slit SLT and memory pillar MP, which will be described later.

The active blocks ABLK and the dummy blocks DBLK extend along the X direction. The four active blocks ABLK are arranged in the Y direction, and are placed between the dummy blocks DBLK.

Specifically, for example, the dummy blocks DBLK1 and DBLK2, active blocks ABLK1 to ABLK4, dummy blocks DBLK3 and DBLK4 are arranged in order along the Y direction.

Note that the active blocks ABLK and dummy blocks DBLK can be arranged optionally in the block group BLKG if the block provided at either end of the block group at least in the Y direction has only to be a dummy block DBLK.

The slits SLT are provided to extend from the hookup area HA1 to the hookup area HA2 along the X direction and are arranged in the Y direction. Between adjacent slits SLT, for example, one slit SLTa and two slits SLTb are arranged.

For example, between adjacent slits SLT, the slit SLTa and SLTb are provided to extend along the X direction. The two slits SLTb are arranged in their respective hookup areas HA1 and HA2. The slit SLTa is disposed between the slit SLTb in the hookup area HA1 and the slit SLTb in the hookup area HA2.

In other words, between adjacent slits SLT, for example, a transverse slit extending in the X direction and including a slit dividing section DJ is provided. The transverse slit is divided by the slit dividing section DJ in each of the hookup areas HA1 and HA2. Of the divided transverse slits, a slit portion extending from the hookup area HA1 to the hookup area HA2 corresponds to the slit SLTa, and a slit portion provided in each of the hookup areas HA1 and HA2 corresponds to the slit SLTb.

The configuration between adjacent slits SLT described above corresponds to, for example, one active block ABLK or one dummy block DBLK.

Note that the number of block groups BLKG included in the memory cell array 10 can optionally be set. The number of active blocks ABLK included in each block group BLKG and the number of dummy blocks DBLK included therein may be the same or different.

The arrangement of the slits SLTa and that of the slits SLTb may be the same or different between the active block ABLK and the dummy block DBLK. The number of slits SLTa and SLTb arranged between the slits SLT can optionally be set. The slit dividing portion DJ can be omitted between the slits SLT.

(Configuration of Memory Cell Array 10 in Cell Area CA)

FIG. 5 shows an example of a planar layout in the cell area CA of the memory cell array 10 included in the semiconductor memory 1 according to the embodiment, extracting one active block ABLK and one dummy block DBLK.

As shown in FIG. 5, the cell area CA of the memory cell array 10 includes a plurality of memory pillars MP. Between the slit SLT and the slit SLTa, for example a slit SHE is provided.

Between the slit SLT and the slit SHE, the memory pillars MP are arranged, for example, in a staggered manner. Similarly, between the slit SLTa and the slit SHE, the memory pillars MP are arranged, for example, in a staggered manner. The memory pillars MP function as, for example, one NAND string.

For example, in the active block ABLK, a set of memory pillars MP provided between the slit SLT and the slit SHE corresponds to one string unit SU. Similarly, a set of memory pillars MP provided between the slit SLTa and the slit SHE corresponds to one string unit SU.

Thus, in the active block ABLK, the string unit SU is provided to extend along the X direction, and the string units SU0 to SU3 are arranged in the Y direction. The planar layout of the dummy block DBLK in the cell area CA may be the same as or different from that of the active block ABLK.

FIG. 6 shows an example of a more detailed planar layout in the cell area CA of the memory cell array 10 included in the semiconductor memory 1 according to the embodiment, extracting the string units SU0 and SU1 of the active block ABLK.

As shown in FIG. 6, the cell area CA of the memory cell array 10 may also include a plurality of dummy pillars DMP. The dummy pillars DMP, for example, have a configuration similar to that of the memory pillars MP and are not used for storage of data. The dummy pillars DMP are, for example, arranged to overlap the slits SHE.

In the cell area CA, a plurality of bit lines BL and a plurality of contacts CV are arranged to correspond to the memory pillars MP.

Specifically, the bit lines BL extend in the Y direction and are arranged in the X direction. Each of the bit lines BL is placed to overlap at least one memory pillar MP for each string unit SU. For example, two bit lines BL overlap each memory pillar MP.

Each contact CV is disposed between one of the bit lines BL overlapping a memory pillar MP and the memory pillar MP. Each memory pillar MP is electrically connected to its corresponding bit line BL via the contact CV.

Note that the number of string units SU provided between adjacent slits SLT can optionally be set. The number of memory pillars MP shown is only an example, as is the arrangement thereof. The number and arrangement of memory pillars MP can optionally be set. The number of bit lines BL overlapping each memory pillar MP can optionally be set.

Figure 7:
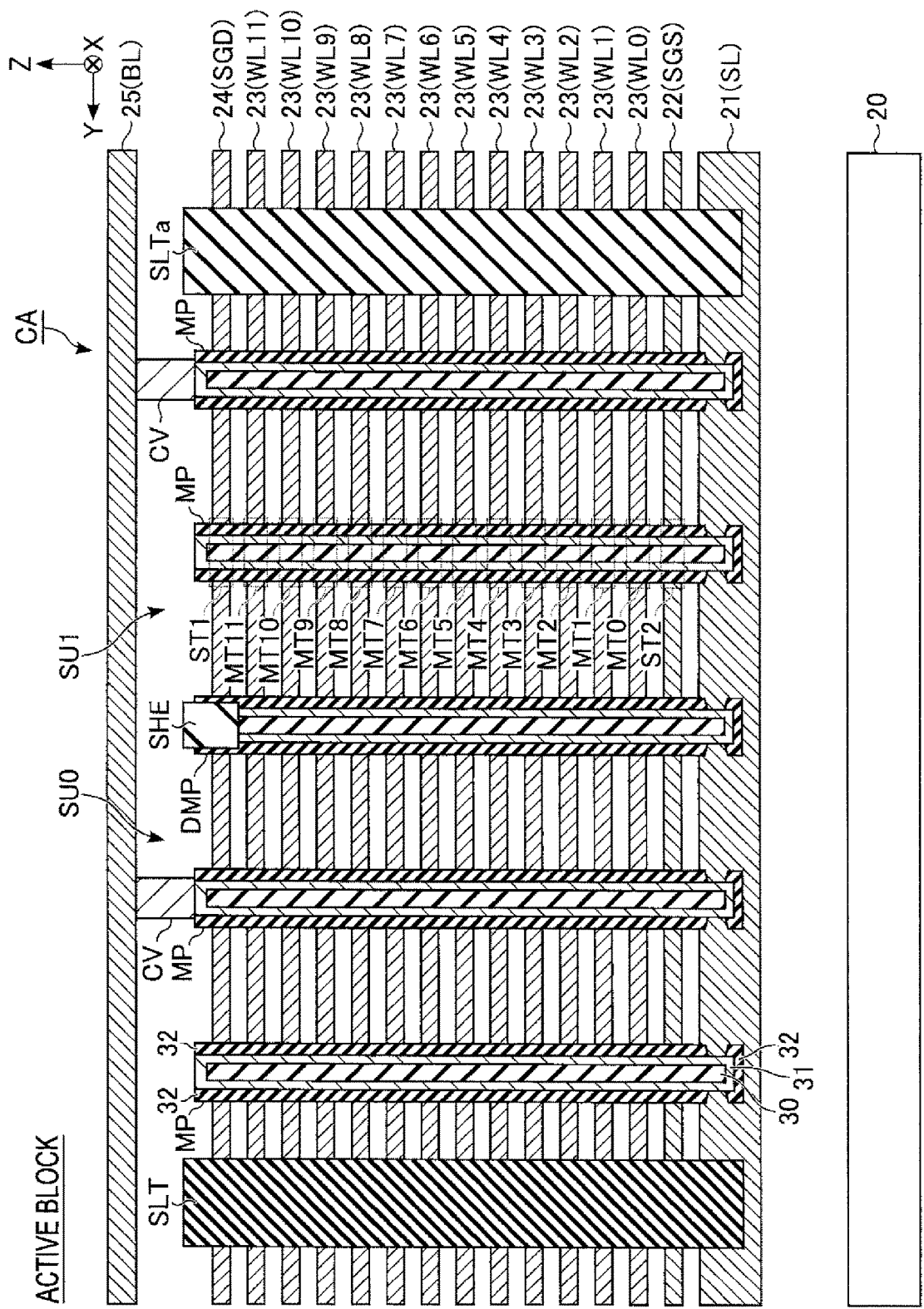
FIG. 7 is a sectional view showing an example of a sectional configuration in the cell area of the memory cell array included in the semiconductor memory according to the embodiment.

FIG. 7 is a sectional view of the memory cell array 10 taken along line VII-VII of FIG. 6, showing an example of a sectional configuration of the active block ABLK in the cell area CA.

As shown in FIG. 7, an area corresponding to the active block ABLK in the cell area CA includes, for example, conductors 21 to 25, memory pillars MP, a dummy pillar DMP, contacts CV and slits SLT, SLTa and SHE.

The conductor 21 is provided above the semiconductor substrate 20 with an insulating layer between them. Though not shown, for example, a circuit such as the row decoder module 15 and the sense amplifier module 16 is provided in the insulating layer between the semiconductor substrate 20 and the conductor 21.

The conductor 21 is shaped like a plate that expands, for example, along the XY plane and used as a source line SL. The conductor 21 is, for example, phosphorus-doped polysilicon (Si).

The conductor 22 is provided above the conductor 21 with an insulating layer therebetween. The conductor 22 is shaped like a plate that expands, for example, along the XY plane and used as a select gate line SGS. The conductor 22 is, for example, phosphorus-doped polysilicon (Si).

The insulating layers and the conductors 23 are stacked alternately above the conductor 22. The conductors 23 are each shaped like a plate that expands, for example, along the XY plane. For example, the stacked conductors 23 are used as their respective word lines WL0 to WL11 in order from the semiconductor substrate 20. The conductors 23 include, for example, tungsten (W).

The conductor 24 is provided above the conductor 23 with an insulating layer therebetween. The conductor 24 is shaped like a plate that expands, for example, along the XY plane and used as a select gate line SGD. The conductor 24 includes, for example, tungsten (W).

The conductor 25 is provided above the conductor 24 with an insulating layer therebetween. The conductor 25 is shaped like a line that extends, for example, along the Y direction and used as a bit line BL. That is, a plurality of conductors 25 are arranged in the X direction in an area not shown. The conductors 25 include, for example, copper (Cu).

The memory pillars MP are each shaped like a column that extends along the Z direction and penetrate, for example, the conductors 22 to 24. For example, the upper ends of the memory pillars MP are included between a layer provided with the conductor 24 and a layer provided with the conductor 25. The lower ends of the memory pillars MP are included in, for example, a layer provided with the conductor 21, and is in contact with the conductor 21.

The memory pillars MP each include, for example, a core member 30, a semiconductor 31 and a stacked film 32. The core member 30 is shaped like a column that extends along the Z direction. The upper end of the core member 30 is included in, for example, a layer that is higher than the layer in which the conductor 24 is provided. The lower end of the core member 30 is included in, for example, the layer in which the conductor 21 is provided. The core member 30 includes, for example, an insulator such as silicon oxide ($SiO_2$).

The core member 30 is covered with the semiconductor 31. The semiconductor 31 is in contact with the conductor 21 through the side surfaces of the memory pillar MP. The semiconductor 31 is, for example, polysilicon (Si). The stacked film 32 covers the side surfaces and undersurface of the semiconductor 31, excluding a portion where the conductor 21 and the semiconductor 31 are in contact with each other. The columnar contact CV is provided on the semiconductor 31. One conductor 25, i.e. one bit line BL is in contact with the top surface of the contact CV.

The dummy pillar DMP is shaped like a column that extends along the Z direction and penetrates, for example, the conductors 22 to 24. The detailed configuration of the dummy pillar DMP is similar to that of, e.g. the memory pillar MP. For example, no contacts CV are connected to the dummy pillar DMP.

The slit SLT is shaped like a plate that expands, for example, along the XZ plane and divide the conductors 22 to 24. For example, the upper end of the slit SLT is included in a layer between the layer including the upper end of the memory pillar MP and the layer provided with the conductor 25. The lower end of the slit SLT is included in, for example, the layer provided with the conductor 21. The slit SLT include, for example, an insulator such as silicon oxide ($SiO_2$). The configuration of the slit SLTa is similar to that of, e.g. the slit SLT.

The slit SHE is provided to extend in, for example, the X direction and divide the conductor 24. The slit SHE may divide part of the dummy pillar DMP. For example, the upper end of the slit SHE is included in a layer between the layer including the upper end of the memory pillar MP and the layer provided with the conductor 25. The lower end of the slit SHE is included in, for example, a layer between the uppermost conductors 23 and 24. The slit SHE includes an insulator such as silicon oxide ($SiO_2$). The slit SHE extending in the X direction may be divided by the dummy pillar DMP in a position where the slit SHE overlaps the dummy pillar DMP.

FIG. 8 shows an example of a sectional configuration of the memory pillar MP including the conductor 23, which is parallel to the surface of the semiconductor substrate 20.

As shown in FIG. 8, the core member 30 is provided in the central part of the memory pillar MP in the layer including the conductor 23. The semiconductor 31 surrounds the side of the core member 30. The stacked film 32 surrounds the side of the semiconductor 31. The stacked film 32 includes, for example, a tunnel oxide film 33, an insulating film 34 and a block insulating film 35.

The tunnel oxide film 33 surrounds the side of the semiconductor 31. The insulating film 34 surrounds the side of the tunnel oxide film 33. The block insulating film 35 surrounds the side of the insulating film 34. The conductor 23 surrounds the side of the block insulating film 35.

In the configuration of the memory pillar MP described above, for example, a portion at which the memory pillar MP and the conductor 22 intersect functions as the select transistor ST2. A portion at which the memory pillar MP and the conductor 23 intersect functions as the memory cell transistor MT. A portion at which the memory pillar MP and the conductor 24 intersect functions as the select transistor ST1.

That is, the semiconductor 31 in the memory pillar MP functions as a channel of each of the memory cell transistor MT and select transistors ST1 and ST2. The insulating film 34 in the memory pillar MP functions as a charge accumulation layer of the memory cell transistor MT.

Figure 9:
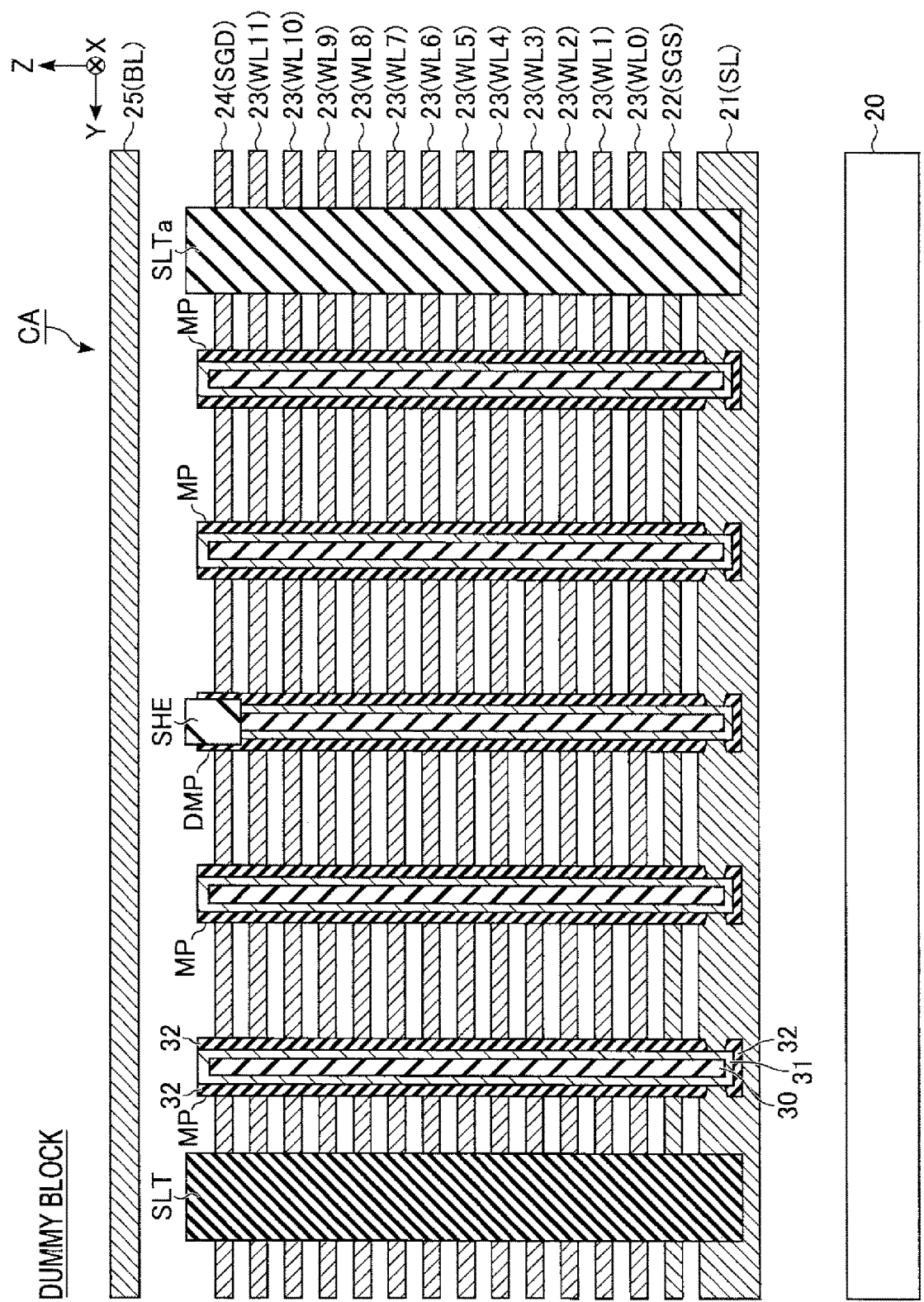
FIG. 9 is a sectional view showing an example of a sectional configuration in the cell area of the memory cell array included in the semiconductor memory according to the embodiment.

FIG. 9 is a sectional view of the memory cell array 10 according to the embodiment, showing an example of a sectional configuration of the dummy block DBLK in the cell area CA.

As shown in FIG. 9, an area corresponding to the dummy block DBLK in the cell area CA includes, for example, conductors 21 to 25, memory pillars MP, a dummy pillar DMP and slits SLT, SLTa and SHE. The configuration of the dummy block DBLK is similar to, for example, the configuration in which the contacts CV are excluded from the active block ABLK.

Preferably, the dummy block DBLK in the cell area CA is, for example, configured not to include contacts CV, but it may include them. That is, in the dummy block DBLK, the memory pillars MP and the conductor 25 may electrically be connected together or not.

Note that in the active block ABLK, the memory pillars MP and the conductor 25 may electrically be connected via two or more contacts or via other interconnect. In this case, the dummy block DBLK may be configured to form contacts and interconnect between the memory pillars MP and the conductor 25 like the active block ABLK or it may have the configuration in which part of the contacts and interconnect is excluded from the active block ABLK.

(Configuration of Memory Cell Array 10 in Hookup Area HA)

Figure 10:
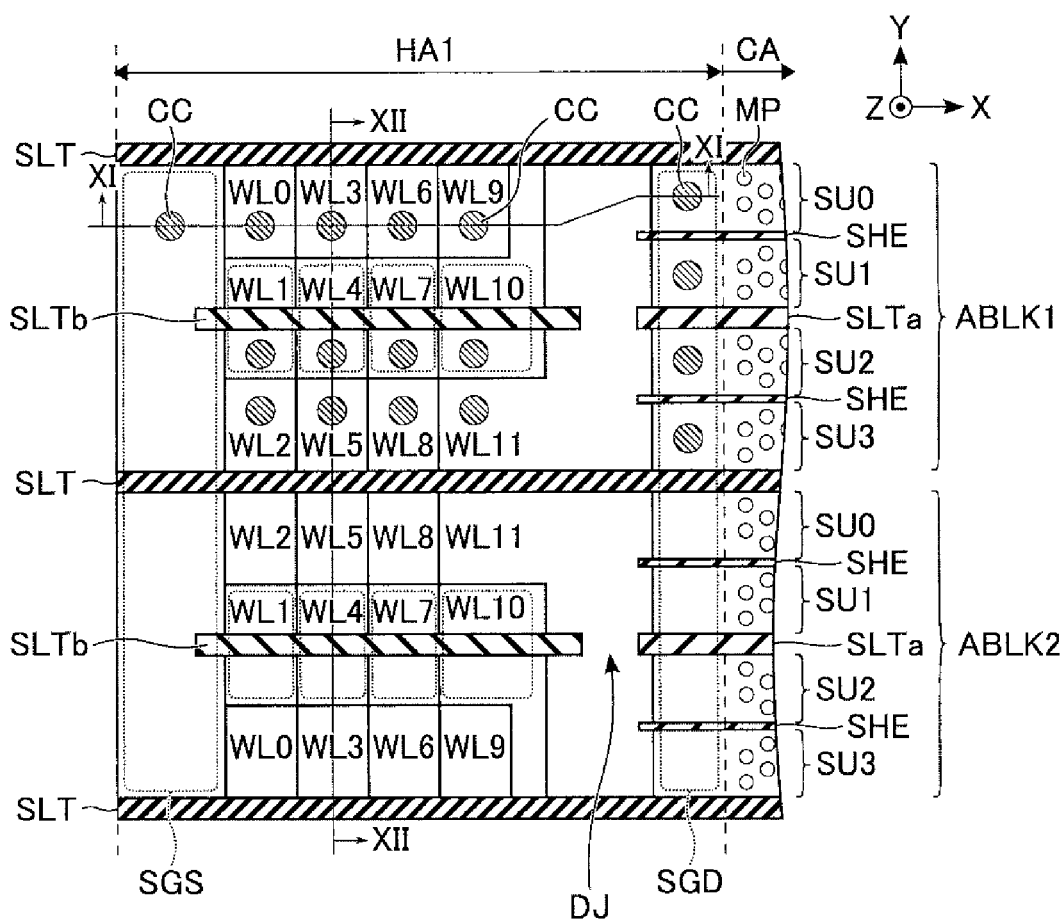
FIG. 10 is a plan view showing an example of a planar layout in a hookup area of the memory cell array included in the semiconductor memory according to the embodiment.

FIG. 10 shows an example of a planar layout in the hookup area HA1 of the memory cell array 10 included in the semiconductor memory 1 according to the embodiment, extracting the active blocks ABLK1 and ABLK2. First, the planar layout of the active block ABLK1 in the hookup area HA1 will be described.

As shown in FIG. 10, the select gate line SGD (conductor 24) is divided into four select gate lines SGD by the slits SLT, SLTa and SHE in an area corresponding to the active block ABLK1 in the hookup area HA1. The four select gate lines SGD correspond to their respective string units SU0 to SU3.

The word lines WL0 to WL11 (conductors 23) have a portion (terraced portion) that does not overlap the upper conductor. For example, the conductors 23, which correspond to their respective word lines WL0 to WL11, are arranged stepwise in three lines with two steps in the Y direction and multiple steps in the X direction.

The slit dividing section DJ is placed in, for example, the terraced portion of the word line WL11. The word lines WL provided in the same layer in the same active block ABLK are shorted-circuited through the slit dividing section DJ. The slit SLTb is, for example, placed to divide the terraced portions of, e.g. the word lines WL1, WL4, WL7 and WL10.

The select gate line SGS (conductor 22) is, for example, drawn in the X direction from the end portions of the word lines WL0 to WL2. The slit SLTb may divide the select gate line SGS or not. The select gate line SGS provided in each of adjacent active blocks ABLk is divided by the slit SLT.

Furthermore, in the area corresponding to the active block ABLK1, for example, a contact CC is provided in the terraced portion of each of the select gate line SGS, word lines WL0 to WL11 and select gate line SGD.

The select gate line SGS, word lines WL0 to WL11 and select gate line SGD in the active block ABLK1 are electrically connected to the row decoder module 15 via the contacts CC provided in the hookup area HA1.

The planar layout of the active block ABLK2 in the hookup area HA1 is similar to, for example, the planer layout of the active block ABLK1, which is reversed symmetrically with regard to the X direction and from which the contacts CC are excluded.

In this case, too, the select gate line SGS, word lines WL0 to WL11 and select gate line SGD in the active block ABLK2 are electrically connected to the row decoder module 15 via the contacts CC provided in the hookup area HA2.

Specifically, the planar layout of the active blocks ABLK1 and ABLK2 in the hookup area HA2 is similar to, for example, the planar layout of the active block ABLK1 and ABLK2 in the hookup area HA1, which is reversed symmetrically with regard to the Y direction and in which the contacts CC are provided to correspond to the interconnect in the active block ABLK2.

Figure 11:
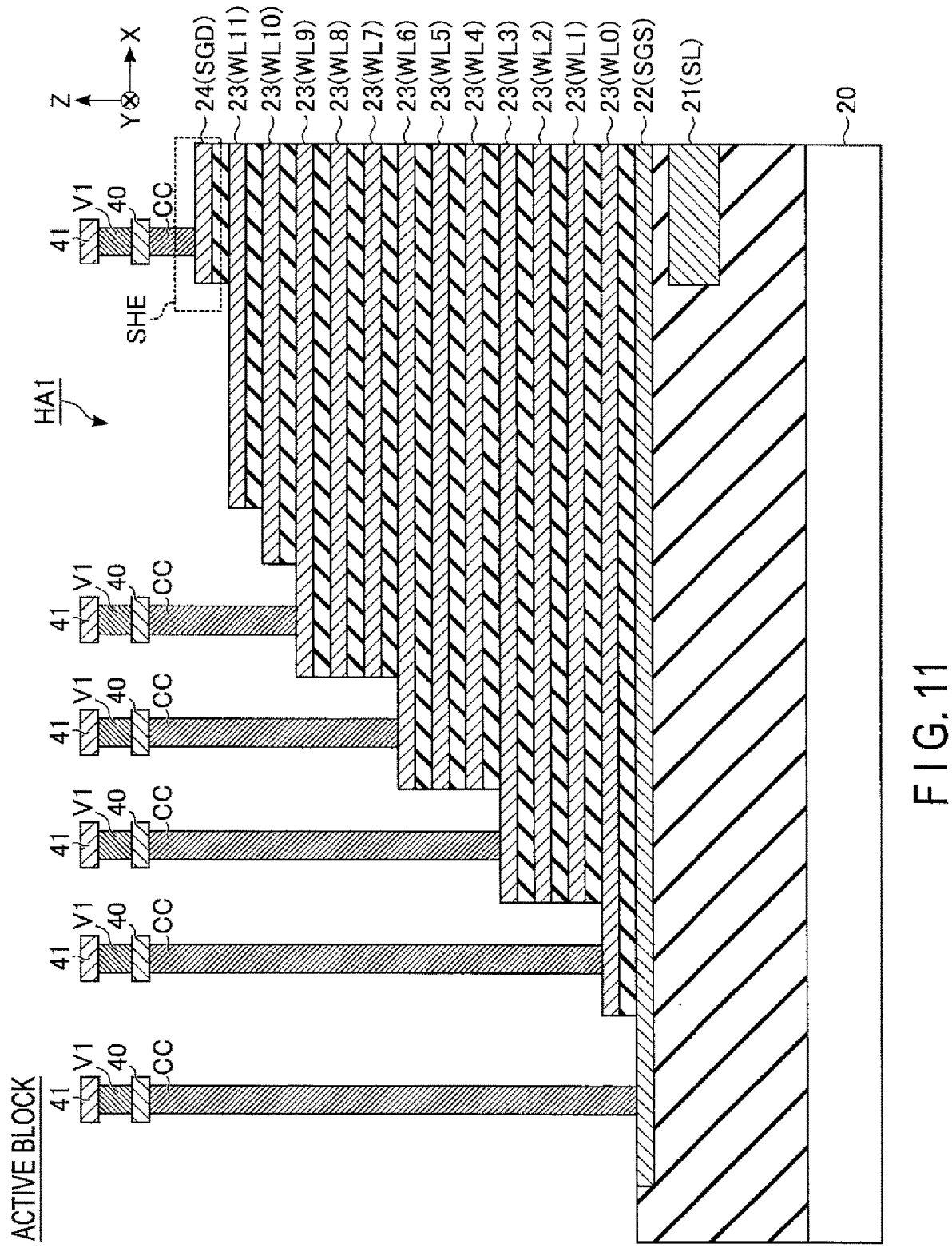
FIGS. 11 and 12 are sectional views showing an example of a sectional configuration in the hookup area of the memory cell array included in the semiconductor memory according to the embodiment.
Figure 12:
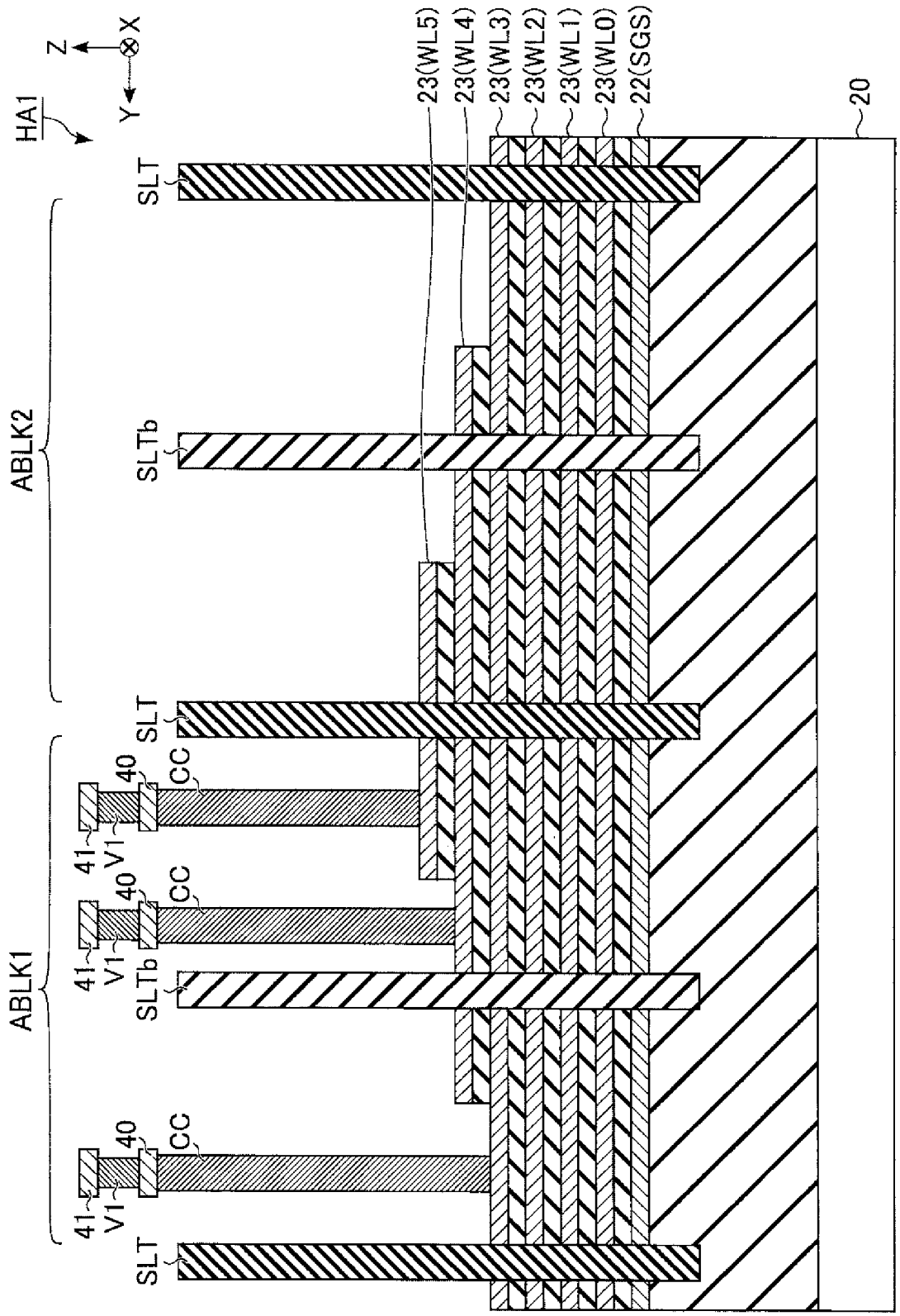

FIG. 11 is a sectional view of the memory cell array 10 taken along line XI-XI of FIG. 10 and FIG. 12 is a sectional view of the memory cell array 10 taken along line XII-XII of FIG. 10. FIGS. 11 and 12 each show an example of a sectional configuration of the active block ABLK in the hookup area HA.

As shown in FIG. 11, the area corresponding to the active block ABLK1 in the hookup area HA1 includes, for example, conductors 21 to 24, 40 and 41 and contacts CC and V1. In FIG. 11, the placement of the slit SHE in the depth direction of the sectional view is shown by the broken line.

In the hookup area HA1, one end of the conductor 21 corresponding to the source line SL is provided more inside than, for example, the conductor 22. The conductor 21 has only to be provided at least in the cell area CA. The conductor 22, conductors 23 and conductor 24, which correspond to the select gate line SGS, word lines WL and select gate line SGD, respectively, each have an end portion that does not overlap the conductor 23 provided at least in the upper layer or the conductor 24. The slit SHE is provided to divide the conductive 24 corresponding to the select gate line SGD.

Each contact CC is formed like a column extending along the Z direction. The contact CC includes, for example, a conductor shaped like a column. The conductor may have a spacer on its side. For example, the conductor contains tungsten (W) and the spacer contains silicon oxide ($SiO_2$).

Each of the conductors 40 and 41 is interconnect for connecting the row decoder module 15 and conductors 22 to 24 drawn from the cell area CA to the hookup area HA1. A plurality of conductors 40 are provided on their respective contacts CC. A plurality of contacts V1 are provided on their respective conductors 40. A plurality of conductors 41 are provided on their respective contacts V1. The conductors 40 and 41 may be connected via a plurality of contacts, and different interconnects are connected between the contacts.

As shown in FIG. 12, the configuration of the conductor 23 in the active block ABLK2 is similar to, for example, the configuration of the conductor 23 in the active block ABLK1, which is reversed symmetrically with regard to the slit SLT between the active blocks ABLK1 and ABLK2.

In other words, the direction in which the number of steps of the word lines WL (conductors 23) formed along the Y direction in the active block ABLK1 increases is opposite to the direction in which the number of steps of the word lines WL (conductors 23) formed along the Y direction in the active block ABLK2 increases.

Specifically, for example, the terraced portion of the word line WL4 of each of the active blocks ABLK1 and ABLK2 is disposed between the terraced portions of the word lines WL3 of the active blocks ABLK1 and ABLK2. The terraced portion of the word line WL5 of each of the active blocks ABLK1 and ABLK2 is disposed between the terraced portions of the word lines WL4 of the active blocks ABLK1 and ABLK2.

In the configuration of the active block ABLK1 in the hookup area HA1 described above, the interconnect drawn via the contact CC is, for example, electrically connected to the circuit under the memory cell array 10 through the interconnect of the dummy block DBLK in the hookup area HA1.

The interconnect drawn via the contact CC may be electrically connected to the circuit under the memory cell array 10, for example, through the area outside the hookup area HA1 or through the contact that penetrates a wide terraced portion provided in the active block ABLK in the hookup area HA1.

FIG. 13 shows an example of a planar layout in the hookup area HA1 of the memory cell array 10 included in the semiconductor memory 1 according to the embodiment, extracting the dummy blocks DBLK1 and DBLK2.

As shown in FIG. 13, the planar layout of the area corresponding to the dummy blocks DBLK1 and DBLK2 in the hookup area HA1 is similar to, for example, the planar layout of the area corresponding to the active blocks ABLK1 and ABLK2 described with reference to FIG. 10, and they are different in the type of contacts to be provided.

Specifically, the dummy block DBLK1 is provided with a contact CCL in place of the contact CC provided in the active block ABLK1. The contacts CC and CCL are made of the same material, and the outside diameter of the contact CCL is larger than that of the contact CC.

The "outside diameter" used in this specification is compared by, for example, a section which is parallel to the surface of the semiconductor substrate 20 and includes the same layer. The "outside diameter of the contact" may be compared by the outside diameter of the conductor in the contact or by the outside diameter of the spacer.

In the embodiment, the contact CCL can be disposed so as not to include a step portion formed by, for example, adjacent word lines WL. The planar layout of the dummy blocks DBLK1 and DBLK2 in the hookup area HA2 can be designed in a manner similar to, for example, the planar layout of the dummy blocks DBLK1 and DBLK2 in the hookup area HA1, which is reversed symmetrically with regard to the Y direction. At least one contact CCL has only to be provided in the hookup areas HA1 and HA2.

Figure 15:
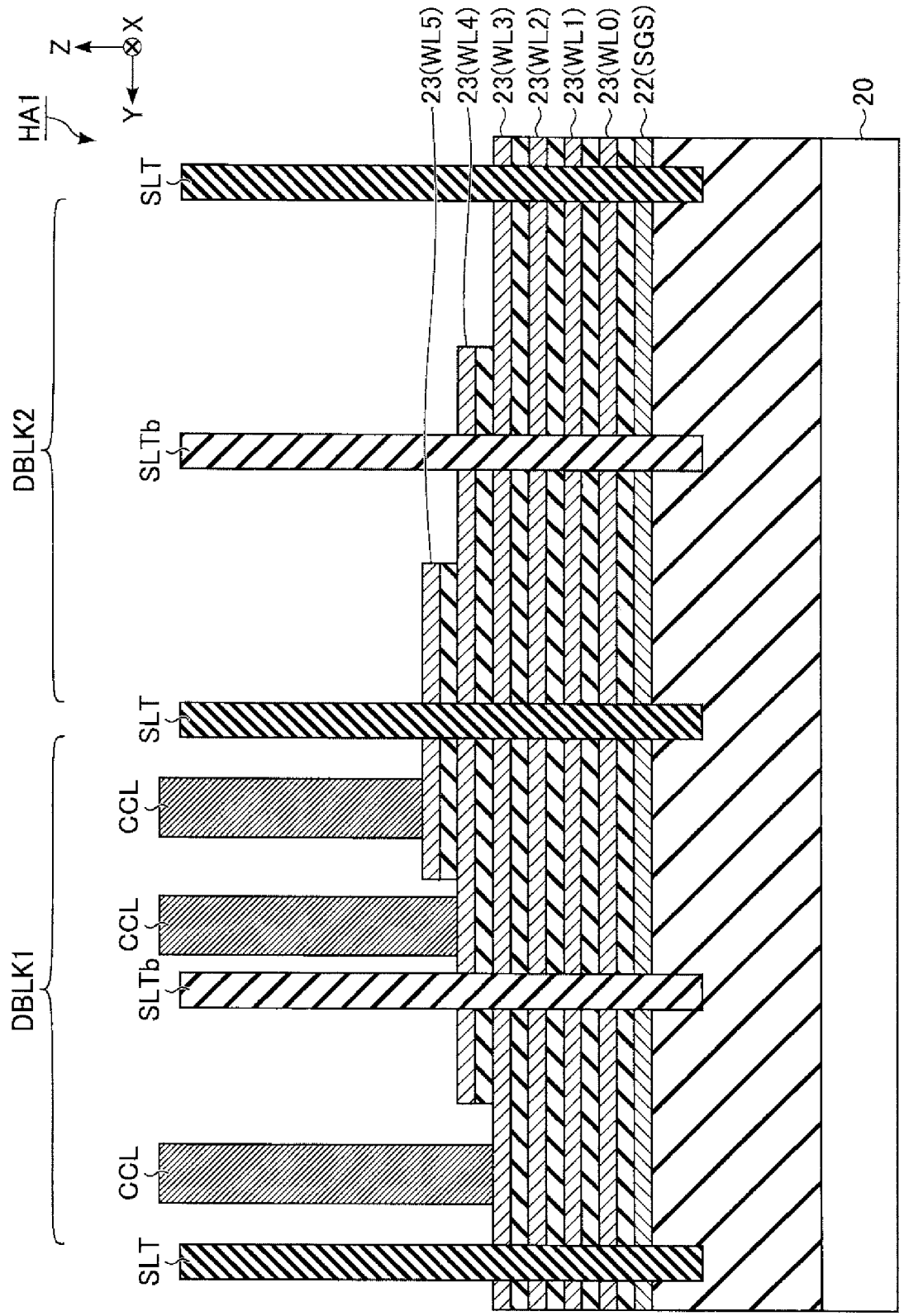

FIG. 14 is a sectional view of the memory cell array 10 taken along line XIV-XIV of FIG. 13 and FIG. 15 is a sectional view of the memory cell array 10 taken along line XV-XV of FIG. 13. FIGS. 14 and 15 each show an example of a sectional configuration of the dummy block DBLK in the hookup area HA.

As shown in FIGS. 14 and 15, the configuration of an area corresponding to the dummy blocks DBLK1 and DBLK2 in the hookup area HA1 differs from, for example, the configuration of the area corresponding to the active blocks ABLK1 and ABLK2 described with reference to FIGS. 11 and 12 in the type of contacts to be provided and in that some of the contacts and interconnects are excluded.

Specifically, in the dummy block DBLK, the contacts CC are replaced with contacts CCL and the contacts V1 and conductors 40 and 41 are excluded. The other configurations in the dummy block DBLK are similar to, for example, the configuration of the active block ABLK and thus their descriptions will be omitted.

Note that the dummy block DBLK may have an interconnect configuration including the contacts V1, conductors 40 and 41 and the like. The contacts CCL may electrically be connected to the circuit under the memory cell array 10 or not.

In the configuration of the memory cell array 10 described above, the number of conductors 23 is designed based on the number of word lines WL. A plurality of conductors 22 provided as a plurality of layers may be allocated to the select gate line SGS. When the select gate line SGS is formed as a plurality of layers, conductors other than the conductors 22 can be used. A plurality of conductors 24 provided as a plurality of layers may be allocated to the select gate line SGD.

For example, the dummy blocks DBLK disposed at both ends of a block group BLKG in the Y direction are each adjacent to a dummy staircase. The dummy staircase is formed by, for example, end portions of the conductors 22 to 24 and corresponds to a staircase configuration including a terraced portion in which the lower-layer conductor does not overlap the upper-layer conductor and to which no contact is connected. In the area of the dummy staircase, some of the conductors 22 to 24 may be replaced with different materials.

[1-2] Method of Manufacturing Semiconductor Memory 1

FIG. 16 is a flowchart showing an example of a method of manufacturing the semiconductor memory 1 according to the embodiment. Of the manufacturing processes of the semiconductor memory 1, a process of forming the memory cell array 10 through a process of forming the contacts CC will be described as appropriate with reference to FIG. 16.

First, a configuration corresponding to the memory cell array 10 is formed (step S10).

Figure 17:
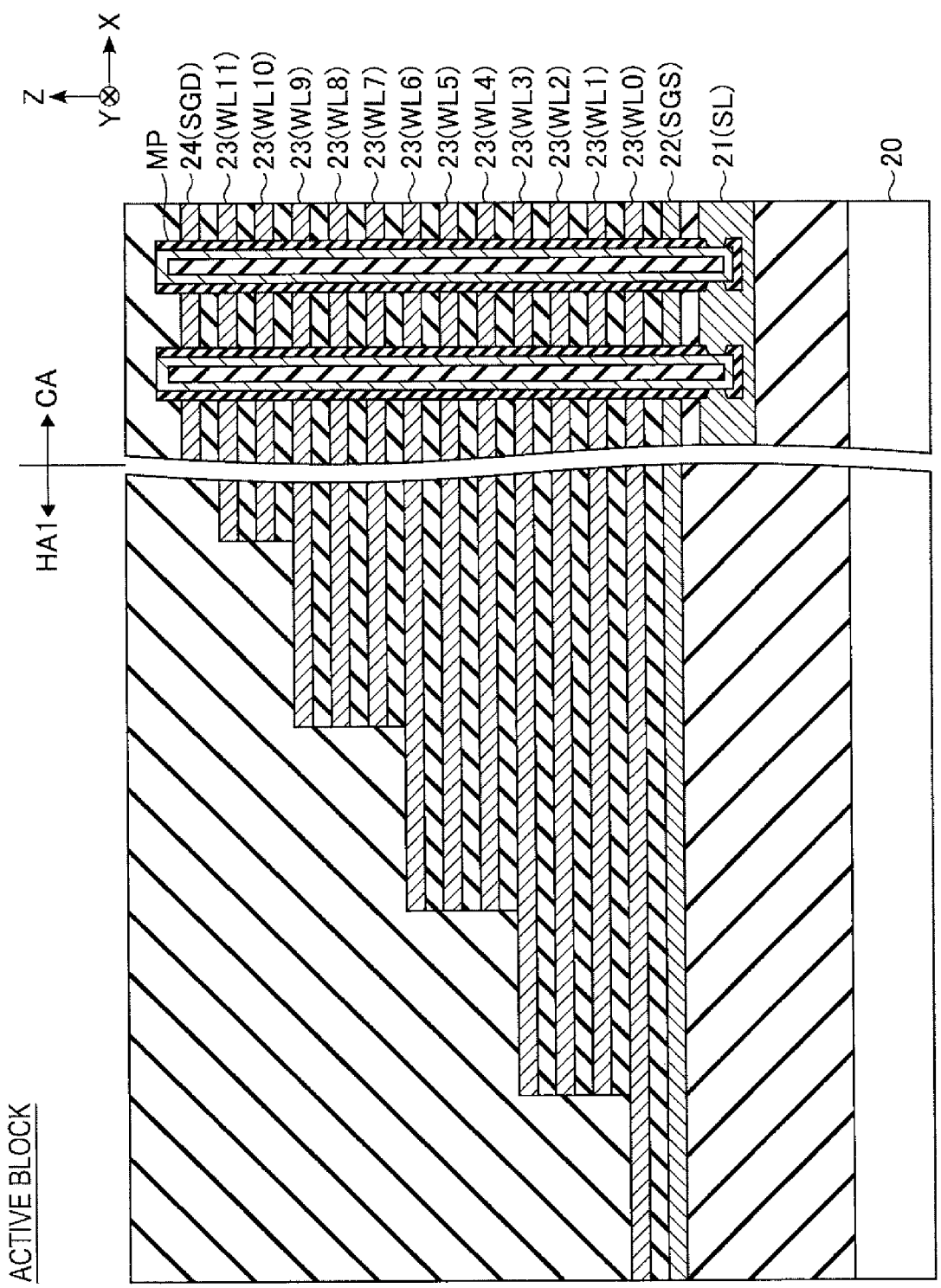
FIG. 17 is a sectional view of the memory cell array, showing an example of a process of manufacturing the semiconductor memory according to the embodiment.

FIG. 17 shows an example of a sectional configuration of the active block ABLK1 in step S10. As shown in FIG. 17, in step S10, a configuration of stacked interconnect corresponding to the conductors 21 to 24 is formed. Further, a plurality of memory pillars MP are formed in the cell area CA, and a staircase configuration of the word lines WL and the like is formed in the hookup area HA1. In the configuration of the stacked interconnect, for example, insulating layers and sacrificial members are alternately stacked and then the sacrificial members are subjected to a replacement process using the slits SLT, SLTa and SLTb, with the result that conductors 21 to 24 can be formed.

Though not shown, for example, a circuit such as the row decoder module 15 and the sense amplifier module 16 is formed in an area between the conductor 21 and the semiconductor substrate 20 or between the conductor 22 and the semiconductor substrate 20. The configuration of the memory cell array 10 in the hookup area HA2 is similar to that of, for example, the memory cell array 10 in the hookup area HA1.

Next, contact holes CH and CHL are formed (step S11).

Figure 19:
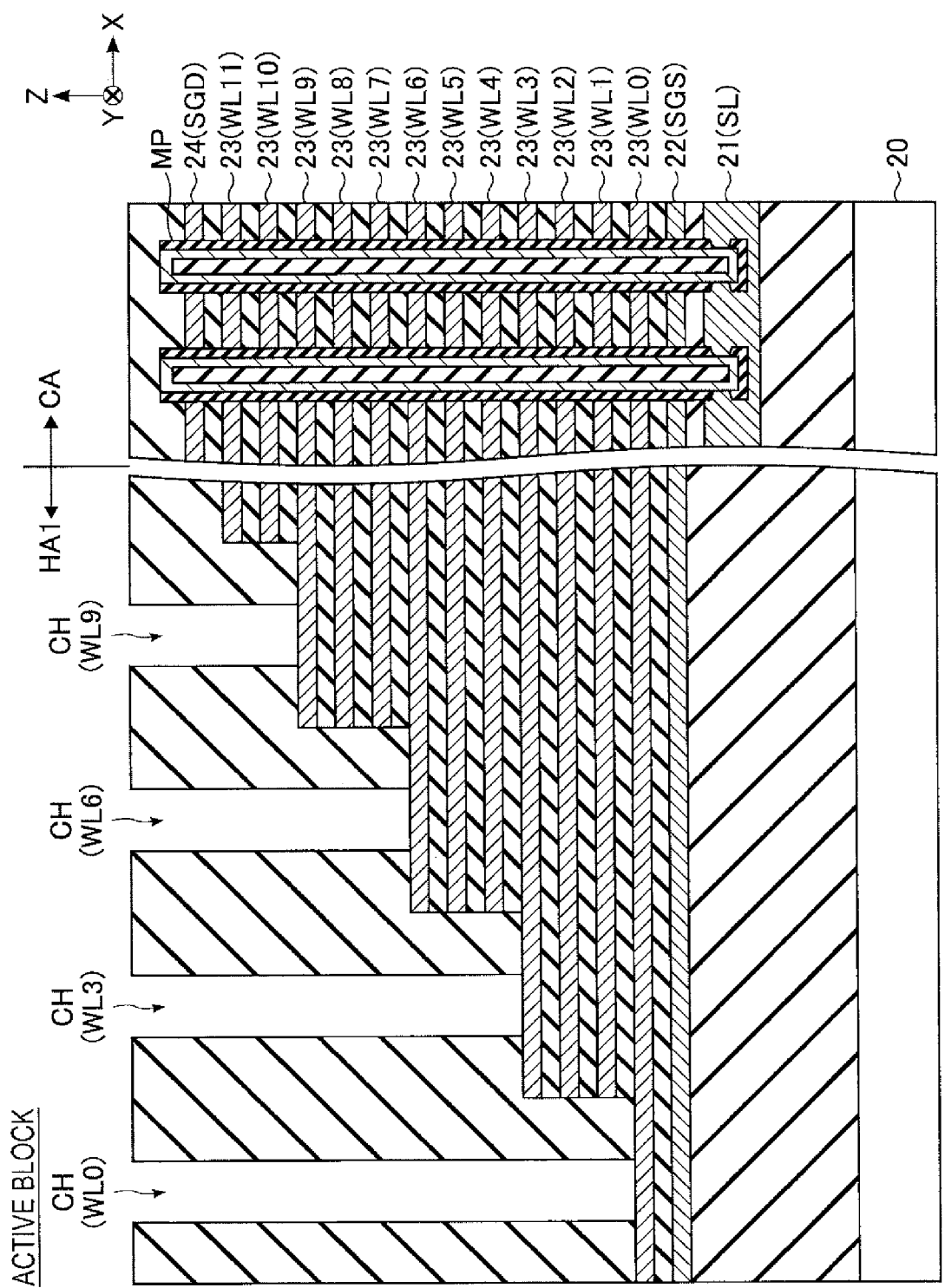
FIGS. 19 and 20 are sectional views of the memory cell array, showing an example of the process of manufacturing the semiconductor memory according to the embodiment.
Figure 20:
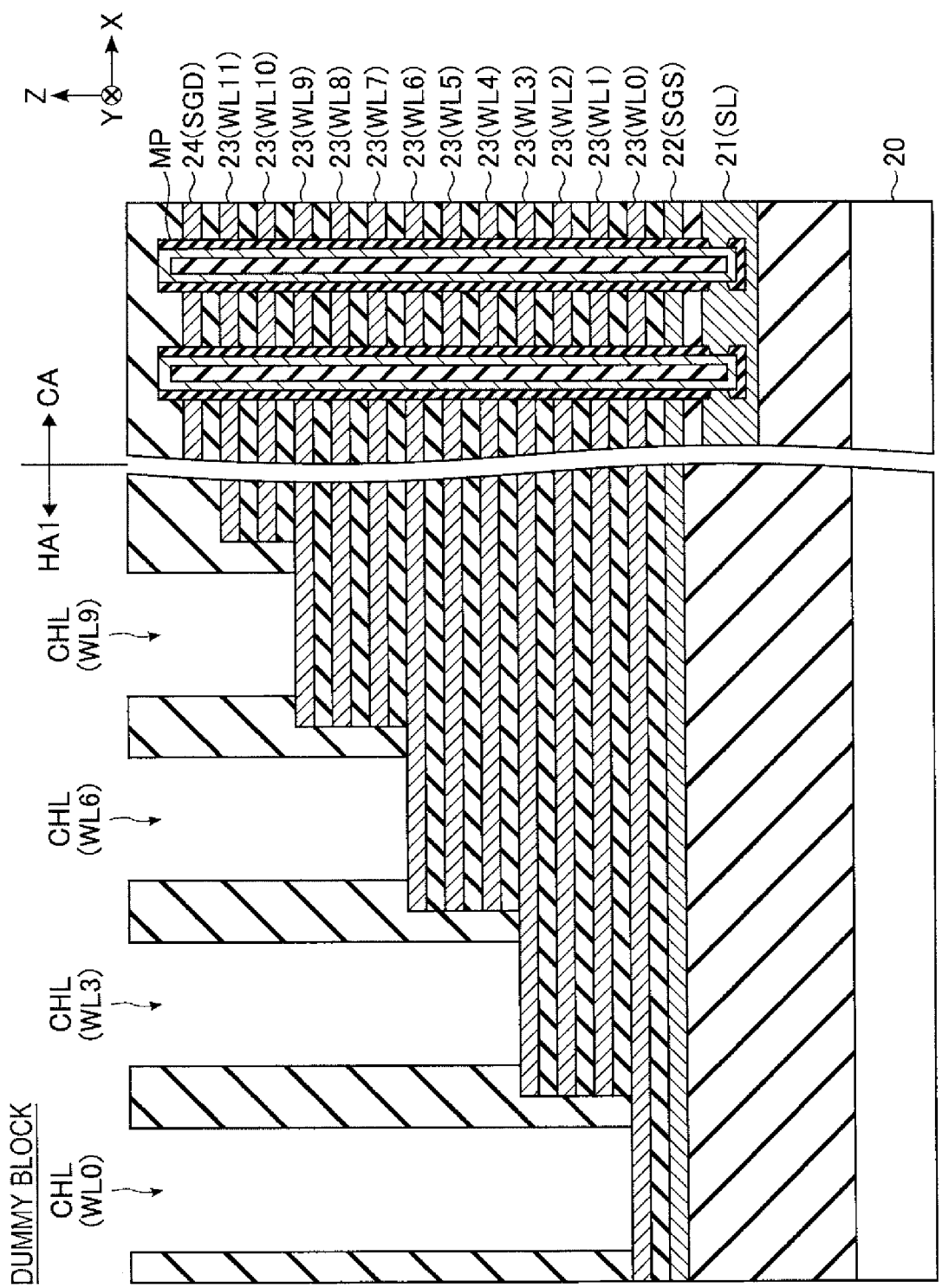

FIG. 18 shows an example of a planar layout of the hookup area HA1 in step S11. FIGS. 19 and 20 respectively show an example of the sectional configuration of the active block ABLK1 and an example of the sectional configuration of the dummy block DBLK1 in step S11.

As shown in FIG. 18, in step S11, the contact holes CH are formed to correspond to an area where the contacts CC are provided in the active block ABLK1, and the contact holes CHL are formed to correspond to an area where the contacts CCL are provided in the dummy block DBLK1.

Specifically, in step S11, first, a mask is formed by photolithography or the like to have opened areas for the contact holes CH and CHL. Then, anisotropic etching is performed using the formed mask to form the contact holes CH and CHL. Thus, the contact holes CH and CHL, are formed, for example, at once in the same process.

As shown in FIG. 19, in the hookup area HA1, the contact holes CH are each formed so as to expose, for example, the surface of the corresponding conductor 23. Specifically, in the active block ABLK, for example, the contact hole CH corresponding to the word line WL0 is formed so as to expose the surface of the conductor 23 corresponding to the word line WL0.

Similarly, the contact holes CH corresponding to the word lines WL3, WL6 and WL9 are formed so as to expose their respective surfaces of the conductors 23 corresponding to the word lines WL3, WL6, and WL9. Similarly, the contact holes not shown are formed so as to expose the surfaces of the corresponding conductors.

As shown in FIG. 20, in the hookup area HA1, the contact holes CHL are each formed so as to expose, for example, the surface of the corresponding conductor 23. Specifically, in the dummy block DBLK, for example, the contact hole CHL corresponding to the word line WL0 is formed so as to expose the surface of the conductor 23 corresponding to the word line WL0.

Similarly, the contact holes CHL corresponding to the word lines WL3, WL6 and WL9 are formed so as to expose their respective surfaces of the conductors 23 corresponding to the word lines WL3, WL6, and WL9. Similarly, the contact holes not shown are formed so as to expose the surfaces of the corresponding conductors.

The inside diameter of the contact hole CHL formed in step S11 is greater than that of the contact hole CH. In this specification, the "inside diameter" is compared by the section which is parallel to the surface of the semiconductor substrate 20 and which includes the same layer. That is, the "inside diameter of the contact hole" is compared by, for example, the inside diameter of the contact hole in the section which is parallel to the surface of the semiconductor substrate 20 and which includes the same layer.

The amount of overlay shift will be measured below (step S12).

Specifically, the dimensions of the bottom of the contact hole CHL is measured using, e.g. a scanning electron microscope (SEM). Then, based on the result of the measurement, the amount of overlay shift of, e.g. the contact holes CH and CHL is calculated.

Figure 21:
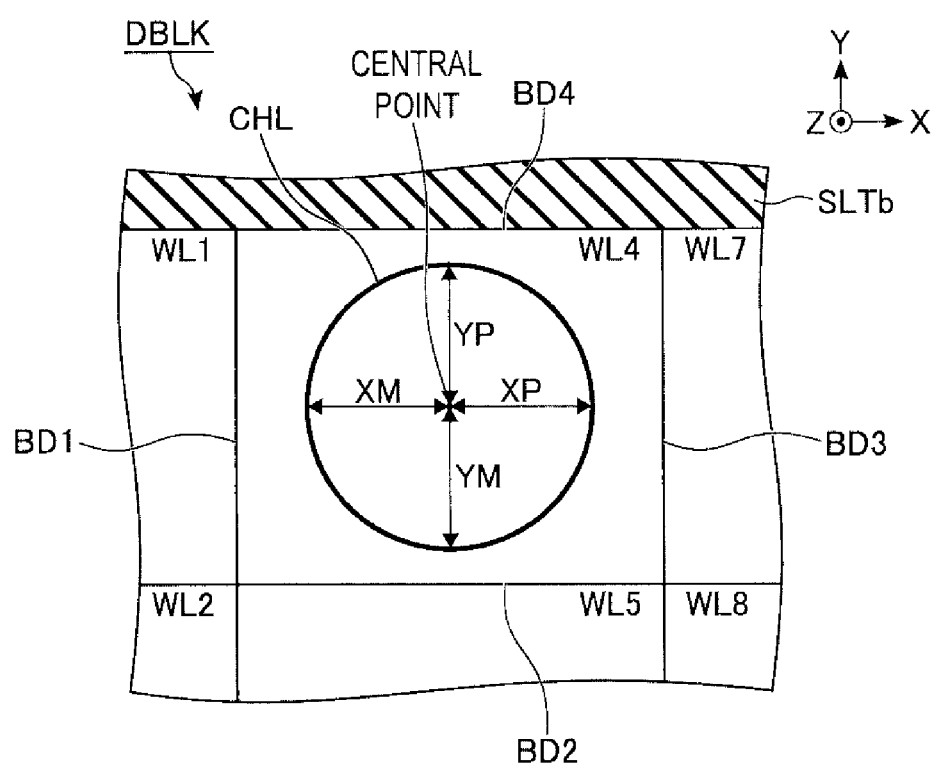
FIG. 21 is a plan view in the hookup area of the memory cell array, showing an example of a method of measuring an amount of overlay shift in the process of manufacturing the semiconductor memory according to the embodiment.

An example of a method for measuring the dimensions of the bottom of the contact hole CHL in step S12 will be described below with reference to FIG. 21. FIG. 21 shows a contact hole CHL corresponding to the word line WL4 of the dummy block DBLK, terraced portions of the word lines WL1, WL2, WL5, WL7 and WL8, and a slit SLTb.

As shown in FIG. 21, in step S12, for example, an interval between the central point of the contact hole CHL and a pattern to be detected first toward the inner peripheral portion of the contact hole CHL from the central point is measured.

Specifically, for example, an interval XP between the central point and a pattern to be detected first toward the positive direction in the X direction from the central point, an interval XM between the central point and a pattern to be detected first toward the negative direction in the X direction from the central point, an interval YP between the central point and a pattern to be detected first toward the positive direction in the Y direction from the central point, and an interval YM between the central point and a pattern to be detected first toward the negative direction in the Y direction from the central point are measured.

When a boundary BD1 between the word lines WL1 and WL4 is included in the area of the contact hole CHL, an interval in the X direction between the central point and the boundary BD1 is measured as the interval XM. When a boundary BD2 between the word lines WL4 and WL5 is included in the area of the contact hole CHL, an interval in the Y direction between the central point and the boundary BD2 is measured as the interval YM.

When a boundary BD3 between the word lines WL4 and WL7 is included in the area of the contact hole CHL, an interval in the X direction between the central point and the boundary BD3 is measured as the interval XP. When a boundary BD4 between the word line WL4 and the slit SLTb is included in the area of the contact hole CHL, an interval in the Y direction between the central point and the boundary BD4 is measured as the interval YP.

If no boundary BD is included in the area of the contact hole CHL, an interval from the central point of the contact hole CHL to the inner peripheral portion thereof is measured as each of the intervals XP, XM, YP and YM.

The fact that each of the intervals XP, XM, YP and YM is a numerical value close to the distance between the central point of the contact hole CHL and the inner peripheral portion thereof, namely, the radius of the contact hole CHL implies that no overlay is shifted or overlay is shifted slightly in this process.

Figure 22:
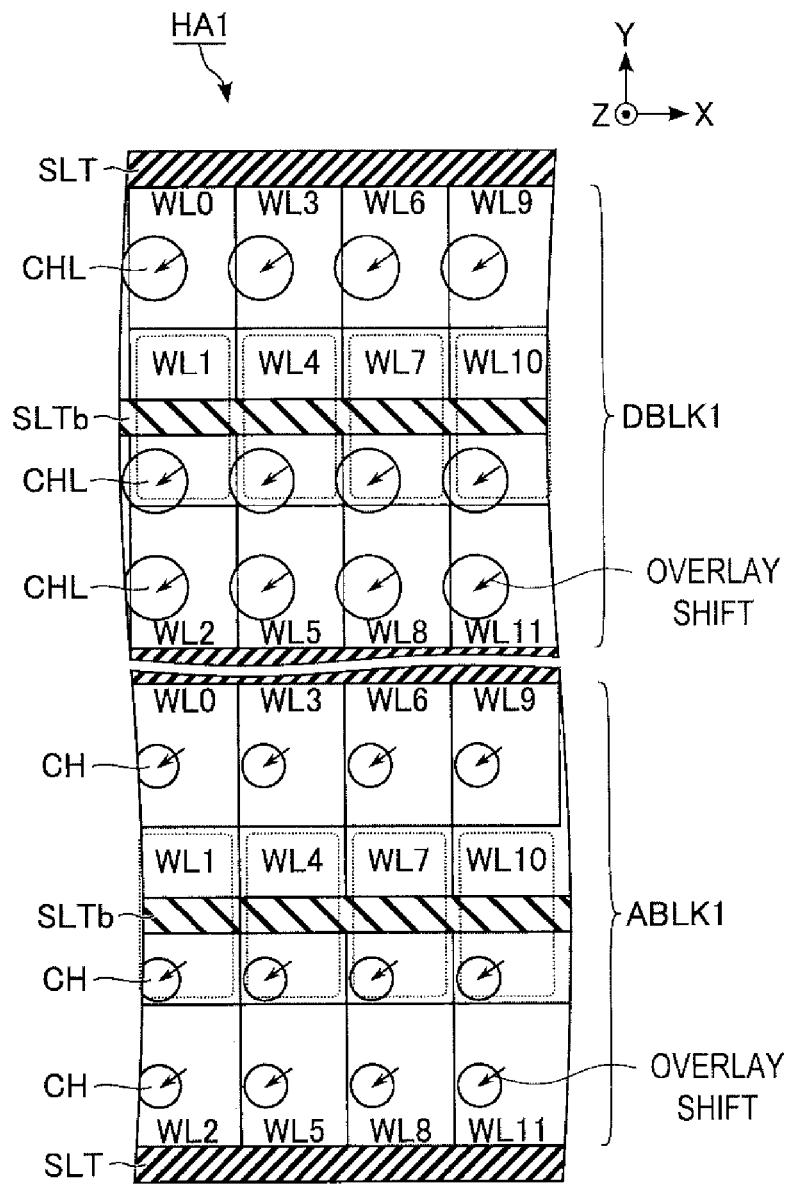
FIG. 22 is a plan view in the hookup area of the memory cell array, showing an example of the process of manufacturing the semiconductor memory according to the embodiment.

On the other hand, when the amount of overlay shift is large, the memory cell array 10 may have a planar layout as shown in FIG. 22. FIG. 22 shows an example of a planar layout of the memory cell array 10. This planar layout differs from that of the memory cell array 10 shown in FIG. 18 in the arrangement of contact holes CH and CHL.

When the amount of overlay shift of the contact holes CH and CHL is large as shown in FIG. 22, a boundary between adjacent terraced portions may be included in the opening of the contact hole CHL. In this example, the boundaries BD1 and BD2 are included in the opening of the contact hole CHL.

Figure 23:
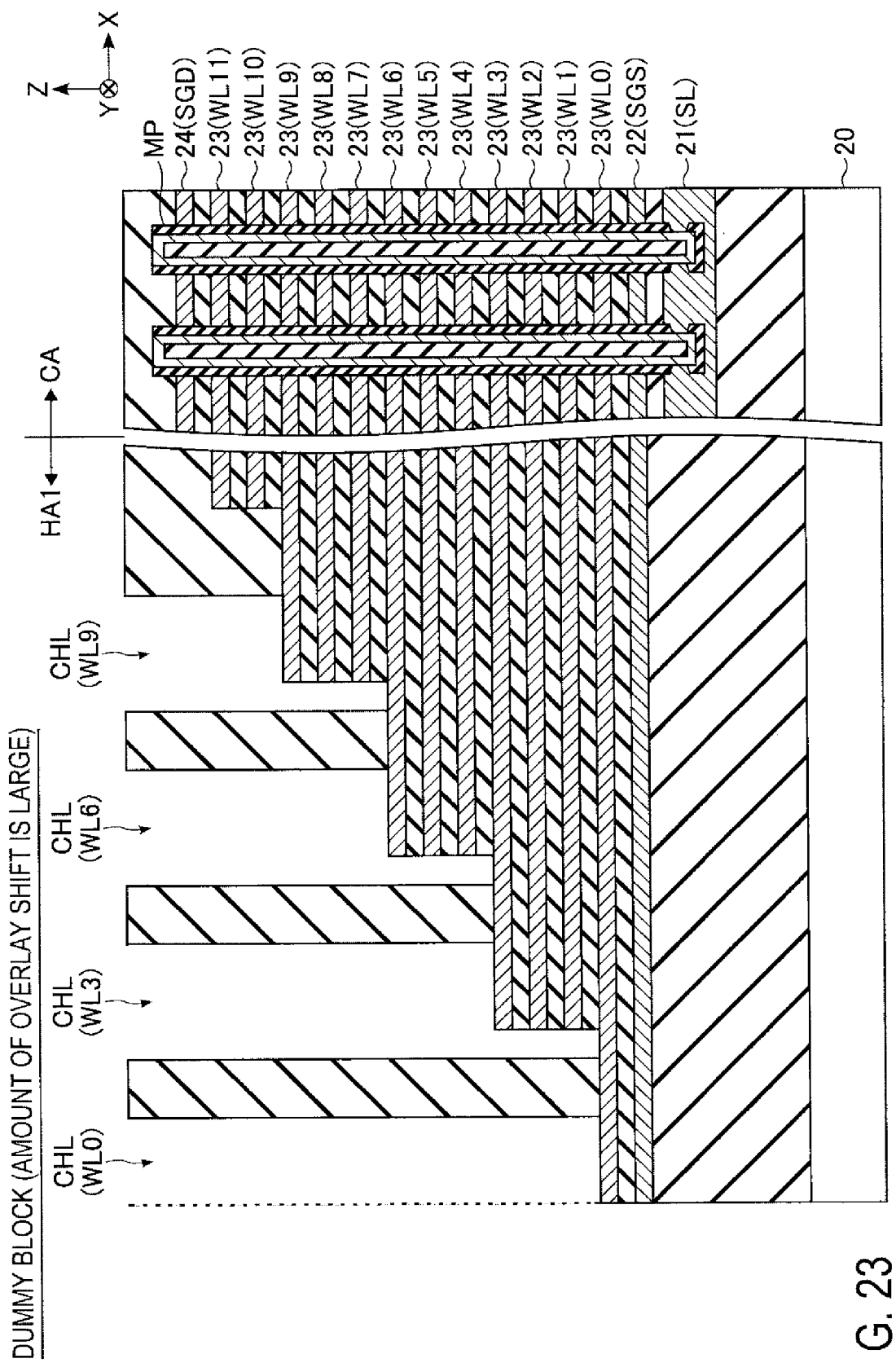
FIG. 23 is a sectional view of the memory cell array, showing an example of the process of manufacturing the semiconductor memory according to the embodiment.

FIG. 23 shows a sectional configuration of the memory cell array 10 when the amount of overlay shift of the contact holes CH and CHL is large. FIG. 23 also shows an example of a sectional configuration of a dummy block DBLK corresponding to the planar layout of the memory cell array 10 shown in FIG. 22.

When the amount of overlay shift of the contact holes CH and CHL is large as shown in FIG. 23, the contact hole CHL in the dummy block DBLK can be opened to an unintended interconnect layer.

Specifically, for example, the contact hole CHL corresponding to the word line WL9 is formed to expose not only the terraced portion of the conductor 23 corresponding to the word line WL9, but also the terraced portion of the conductor 23 corresponding to the word line WL6 and the side surface portions of two conductors 23 corresponding to the word lines WL7 and WL8.

Similarly, the contact hole CHL corresponding to the word line WL6 is formed to expose not only the terraced portion of the conductor 23 corresponding to the word line WL6, but also the terraced portion of the conductor 23 corresponding to the word line WL3 and the side surface portions of two conductors 23 corresponding to the word lines WL4 and WL5.

The contact hole CHL corresponding to the word line WL3 is formed to expose not only the terraced portion of the conductor 23 corresponding to the word line WL3, but also the terraced portion of the conductor 23 corresponding to the word line WL0 and the side surface portions of two conductors 23 corresponding to the word lines WL1 and WL2.

When a contact hole (not shown) in the dummy block BLK includes a boundary between adjacent terraced portions, a configuration in which the terraced portions and side surfaces of the conductors 23 are exposed can be formed.

FIG. 24 shows an example of a method of measuring an amount of overlay shift of the contact holes CH and CHL when the amount of overlay shift is large. FIG. 24 shows an area similar to that shown in FIG. 21, and the area of FIG. 24 differs from that shown in FIG. 21 in the position of the contact hole CHL.

When the amount of overlay shift of the contact hole CHL as shown in FIG. 24 is large, for example, intervals XM and YM are values based on the boundaries BD1 and BD2, respectively. That is, in this example, the intervals XM and YM are values that are respectively smaller than the intervals XM and YM described with reference to FIG. 21.

For example, when the interval XM is shorter than the radius of the contact hole CHL, the overlay of the contact hole CHL is shifted in the negative direction in the X direction. Similarly, when the interval XP is shorter than the radius of the contact hole CHL, the overlay of the contact hole CHL is shifted in the positive direction in the X direction.

When the interval YM is shorter than the radius of the contact hole CHL, the overlay of the contact hole CHL is shifted in the negative direction in the Y direction. When the interval YP is shorter than the radius of the contact hole CHL, the overlay of the contact hole CHL is shifted in the positive direction in the Y direction.

Then, in the method of manufacturing the semiconductor memory 1 according to the embodiment, for example, an ideal interval between the boundary between adjacent terraced portions and the central position of the contact hole CHL is compared with each of the measured intervals XM, XP, YM and YP. As a result, the amount of overlay shift of the formed contact hole CHL can be calculated.

The calculated amount of overlay shift may be fed back as a correction value of parameters used when, for example, the subsequent wafer (lot) is processed. Specifically, the calculated amount of overlay shift can be used to calculate a correction value of overlay in the lithography process to form a mask used in the processing of the contact holes CH and CHL in, for example, step S11.

After the process of step S12 described above, i.e. after the measurement of the amount of overlay shift using the contact hole CHL, contacts CC and CCL are formed (step S13).

Specifically, the conductors are embedded in the contact holes CH and CHL by depositing the conductors in the configuration on the semiconductor substrate 20. When the conductors are removed from the top surface of the configuration, a contact CC is formed to correspond to the position of the contact hole CH, and a contact CCL is formed to correspond to the position of the contact hole CHL.

As a method of removing the conductors from the top surface of the configuration, for example, chemical mechanical polishing (CMP) is used. That is, in step S13, for example, the conductors are removed from the top surface of the configuration through the process of planarizing the top surface of the configuration.

Therefore, for example, the top surface of the contact CC and that of the contact CCL are aligned with each other. In other words, the upper end of the contact CC is substantially equal to that of the contact CCL in the stacking direction of the stacked configuration of the insulating layer and the conductors 23 (word lines WL0 to WL11).

Figure 25:
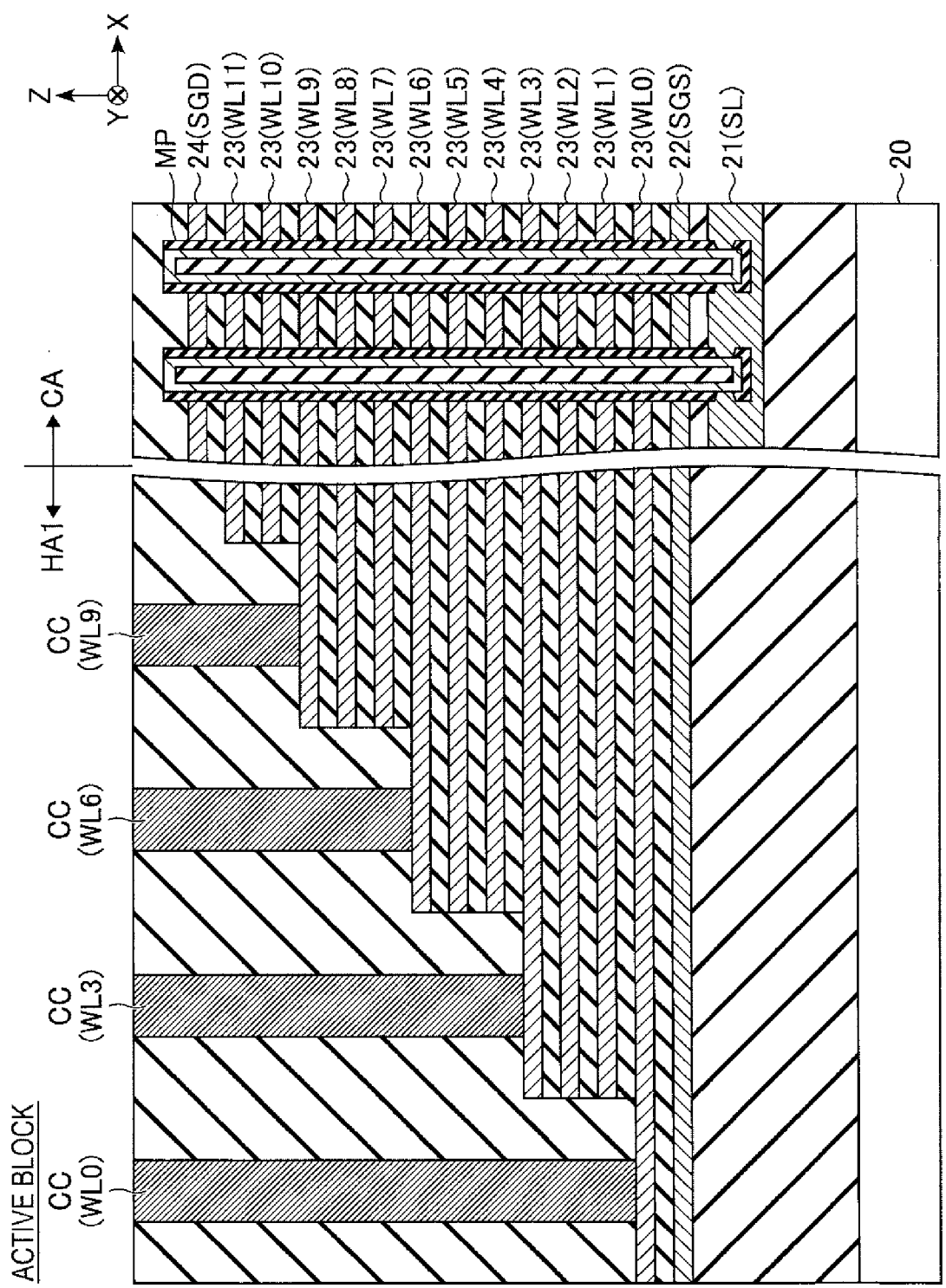
FIGS. 25, 26, and 27 are sectional views of the memory cell array, showing an example of the process of manufacturing the semiconductor memory according to the embodiment.
Figure 26:
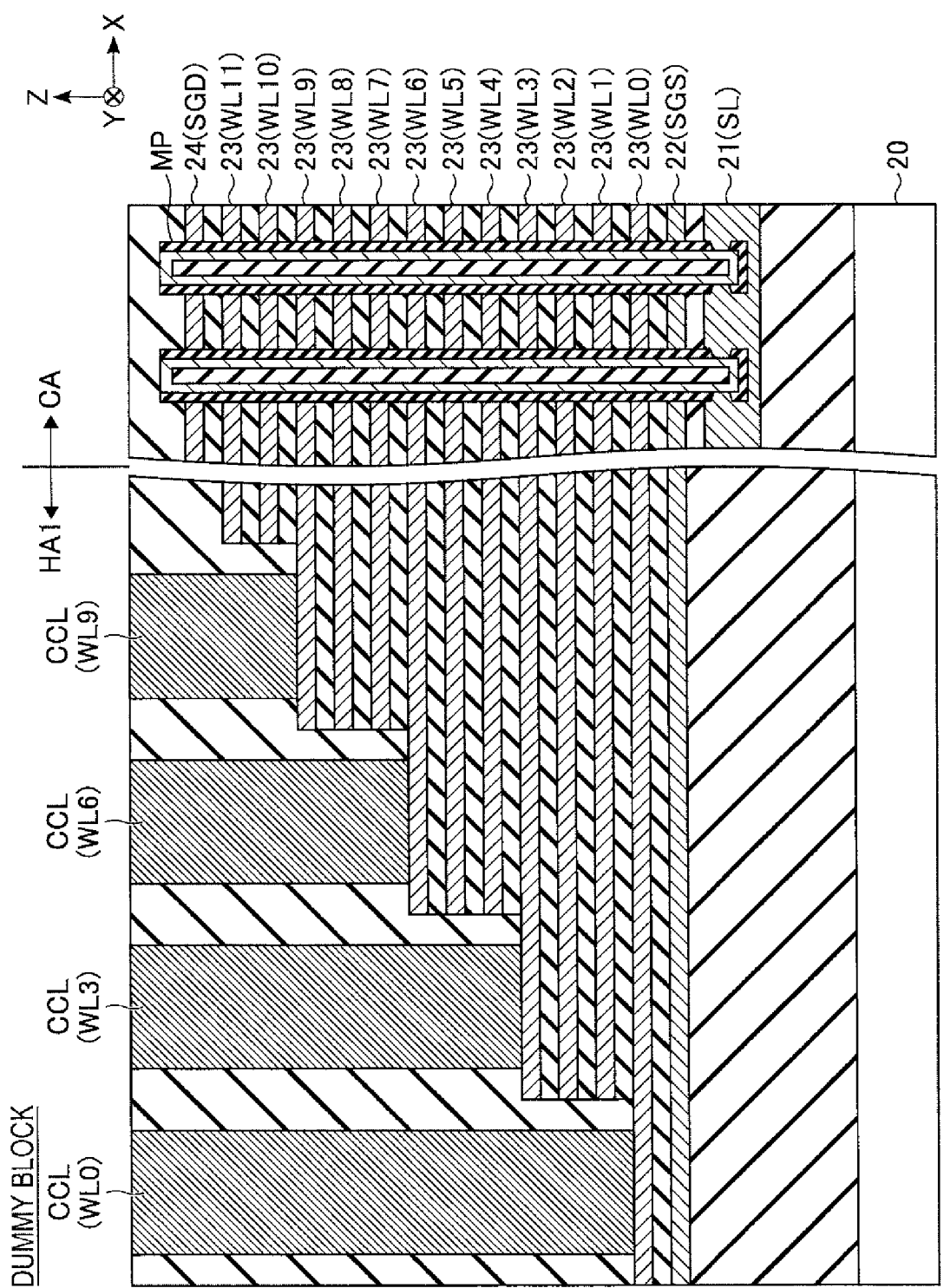

FIGS. 25 and 26 respectively show an example of a sectional configuration of the active block ABLK1 and an example of a sectional configuration of the dummy block DBLK1 after the processing in step S13 in the case where no overlay is shifted in the contact hole CH or CHL.

As shown in FIG. 25, in the hookup area HA1, the contacts CC are formed in space formed by the contact holes CH. Each of the contacts CC formed in the contact holes CH is electrically connected to its corresponding conductor 23 at the bottom thereof.

As shown in FIG. 26, in the hookup area HA1, the contacts CCL are formed in space formed by the contact holes CHL. Each of the contacts CCL formed in the contact holes CHL is electrically connected to its corresponding conductor 23 at the bottom thereof.

Figure 27:
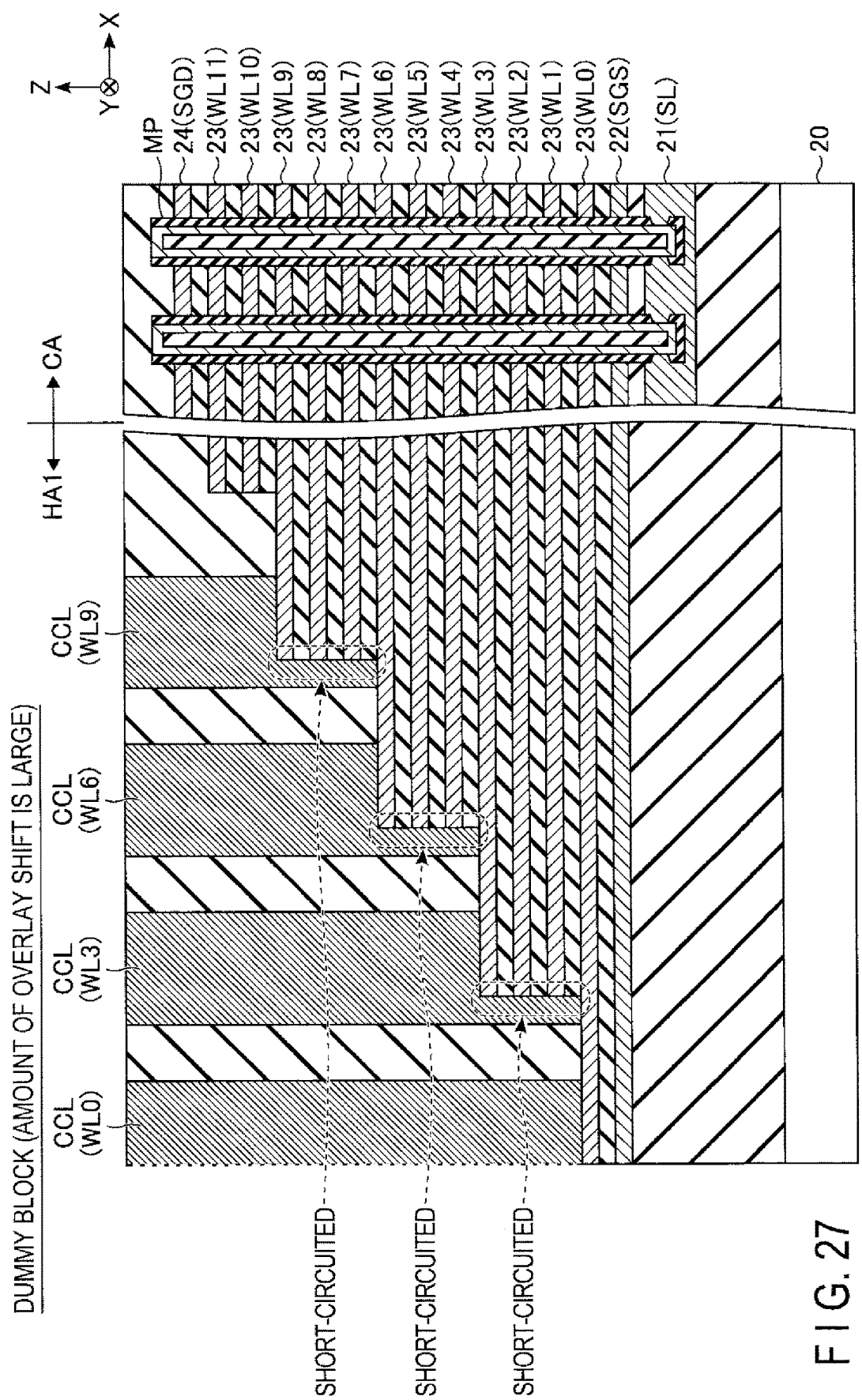

FIG. 27 shows an example of a sectional configuration of the dummy block DBLK1 after the processing in step S13 in the case where the amount of overlay shift of the contact holes CH and CHL is large.

When the amount of overlay shift of the contact holes CH and CHL is large as shown in FIG. 27, the contacts CCL formed in the contact holes CHL may be short-circuited among the conductors 23.

Specifically, for example, the contact CCL corresponding to the word line WL9 is short-circuited among the word lines WL6 to WL9. Similarly, the contact CCL corresponding to the word line WL6 is short-circuited among the word lines WL3 to WL6. The contact CCL corresponding to the word line WL3 is short-circuited among the word lines WL0 to WL3. When a contact not shown includes a boundary between adjacent terraced portions, it may have a configuration of being short-circuited among the conductor 23.

Although conductors 23 of four layers are short-circuited in FIG. 27, the number of conductors 23 to be short-circuited may vary with the direction of overlay shift. For example, when the contact CCL overlaps only the boundary between adjacent terraced portions in the Y direction, it is configured to short-circuit conductors 23 of adjacent two layers.

As described above, in the semiconductor memory 1 according to the embodiment, a contact hole CH and a contact hole CHL whose diameter differs from that of the contact hole CH are opened at once in forming a contact CC. Then, for example, in the same process, a conductor is embedded inside each of the contact holes CH and CHL.

Note that the manufacturing processes described above are only an example and another process may be inserted between the manufacturing processes. The timing with which the memory pillars MP are formed and the timing with which the contact holes CH and CHL are formed may be replaced with each other.

In the process of step S12 described above, for example, a high-acceleration scanning electron microscope (SEM) capable of measuring a deep hole is used. In this case, too, the degree of difficulty in measuring the bottom of the contact hole CHL corresponding to the lower-layer word line WL (e.g. word line WL3) is higher than that of difficulty in measuring the bottom of the contact hole CHL corresponding to the upper-layer word line WL (e.g. word line WL9).

Thus, the diameter of the contact hole CHL is preferably set as large as possible. The contact holes CHL are preferably designed to have such a diameter that the conductors can be embedded in the contact holes CHL and to flattened in the process of step S13.

Furthermore, according to the foregoing descriptions, the bottom of the contact hole CHL is shaped like a true circle; however, it may be shaped like an ellipse. In this case, the amount of overlay shift is determined using, for example, the radius of the major axis of the contact hole CHL and that of the minor axis thereof. When the bottom of the contact hole CHL is elliptical, the "outside diameter of the contact CCL" may indicate the major axis or the minor axis.

[1-3] Advantages of Embodiment

The semiconductor memory 1 according to the embodiment described above makes it possible to improve the yield of the semiconductor memory 1. The following is a detailed description of the advantages of the semiconductor memory 1 according to the embodiment.

In the semiconductor memory in which the memory cells are stacked in three dimensions, the conductors, which are used as gate electrodes of the memory cells, and the interlayer insulating films are alternately stacked to increase the number of stacked layers and thus achieve a large capacity. Then, the conductors used as the gate electrodes of the memory cells, for example, are hooked up like a staircase at the end of the memory cell array (hookup area) and connected to the row decoder module via the contacts connected to the terraced portions of the formed staircase.

In the staircase configuration so formed in the hookup area, its subsequent film forming process and heat treatment may cause to, for example, warp the wafer and thus move the boundary between the stairs. When a variation of the position of the boundary between the stairs is large, the contacts for the word lines WL are likely to be formed to overlap the terraced portions of the word lines WL, which may cause a short circuit among the word lines WL.

For example, the correction of overlay in the lithography process is carried out using an alignment pattern formed in a dicing area on the outer periphery of an area on the wafer where the semiconductor memory 1 is formed. In the overlay measurement in the lithography process, therefore, a variation of the position of a boundary between the stairs cannot be detected.

In contrast, as a method of feeding back the variation of the position of a boundary between the stairs, for example, it is considered to make a result inspection after the contacts are formed to be connected to the staircase. In the result inspection after the formation of the contacts, however, it will be a destructive inspection because the section of the staircase needs to be checked and also a long time is required until the feedback. Further, it is necessary to check the section of the staircase each time the manufacturing process of the semiconductor memory is modified.

Therefore, in the manufacturing method of the semiconductor memory 1 according to the embodiment, the contact holes CHL are formed in the area of the dummy block DBLK that is not used to hold data. The contact holes CHL are formed in the same process as the contact holes CH formed in the active block ABLK, and arranged in the staircase formed in the dummy block DBLK. Furthermore, the diameter of each of the contact holes CHL is designed to be larger than that of each of the contact holes CH.

When the amount of overlay shift increases after the boundary between the stairs has varied, the possibility that the boundary can be viewed from the contact hole CHL becomes high by increasing the diameter of the contact hole CHL. Since, furthermore, the contact holes CHL and CH are formed by the same process, the amount of overlay shift in the contact hole CHL is considered to be substantially the same as the amount of overlay shift in the contact hole CH.

As a result, in the manufacturing method of the semiconductor memory 1 according to the embodiment, if the boundary between the stairs exposed to the bottoms of the contact holes CHL is checked, the amount of overlay shift in the contact holes CH based on the variation of the boundary between the stairs can be estimated.

Furthermore, in the manufacturing method of the semiconductor memory 1 according to the embodiment, since, for example, a scanning electron microscope (SEM) is used as a method for measuring the amount of overlay shift, the variation (incline) of the boundary between the stairs can be evaluated non-destructively and conveniently.

As described above, in the manufacturing method of the semiconductor memory 1 according to the embodiment, the incline of the boundary between the stairs can be evaluated non-destructively and thus a correction value of overlay can be fed back to a wafer (lot) to be processed next. Thus, an appropriate correction value of overlay can be used for the boundary between the stairs to improve the yield of the semiconductor memory 1.

In the foregoing descriptions, the positions of the contacts CC are adjusted based on information that is fed back by the process of step S12. However, the boundary between the stairs may be adjusted based on the feedback information.

In the process of step S12, when the amount of overlay shift exceeds a threshold value, a lot including the wafer may be screened as a defective lot. Screening a number of defective lots during the manufacture of the semiconductor memory 1 can inhibit the manufacturing costs of the semiconductor memory 1 from increasing.

[1-4] Modification to Embodiment

In the semiconductor memory 1 according to the embodiment described above, the arrangement of the contacts CC in the active block ABLK and that of the contacts CCL in the dummy block DBLK are similar to each other. The arrangement of the contacts CCL can be changed as appropriate. The first to fifth modifications to the embodiment will be described in order below.

(First Modification)

FIG. 28 shows an example of a planar layout of the memory cell array 10 in the semiconductor memory 1 according to a first modification to the embodiment. This planar layout differs from that of the memory cell array 10 shown in FIG. 13 in the arrangement of contacts CCL.

As shown in FIG. 28, in the first modification, for example, the planar layout of the memory cell array 10 is so designed that the central point of each of the contacts CCL coincides with a crossing point CP of the boundary between the stairs.

Specifically, for example, the contacts CCL in the hookup area HA1 are, for example, in contact with their respective terraced portions of the conductors 23 corresponding to the word lines WL4, WL5, WL7 and WL8. Similarly, the other contacts CCL are in contact with two terraced portions adjacent in the X direction and two terraced portions adjacent in the Y direction to the two terraced portions.

Note that in the first modification, the outside diameter of each contact CCL may not necessarily be larger than that of each contact CC. That is, in the first modification, the outside diameter of each contact CCL may be the same as or smaller than that of each contact CC. The other configurations of the semiconductor memory 1 according to the first modification are similar to those of the semiconductor memory 1 according to the embodiment and thus their descriptions will be omitted.

Figure 29:
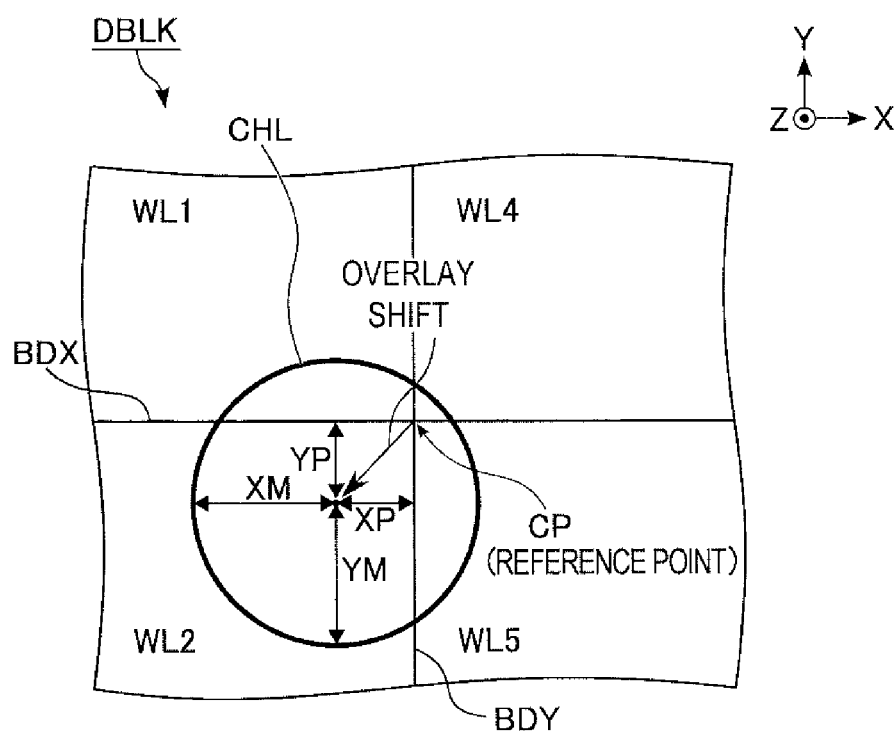
FIG. 29 is a plan view in the hookup area of the memory cell array, showing an example of a method of measuring an amount of overlay shift in the first modification to the embodiment.

FIG. 29 shows an example of a method of measuring an amount of overlay shift in the first modification to the embodiment and also shows an example of a planar layout of the memory cell array 10 after the contact holes CHL are formed to correspond to the contacts CCL.

As shown in FIG. 29, in the first modification, a crossing point CP is used as a reference point of the overlay. In the first modification, therefore, even when the amount of overlay shift is small, boundaries (boundaries BDX and BDY) between the stairs can be included in an area where the contact holes CHL are formed.

As a result, in the manufacturing method of the semiconductor memory 1 according to the first modification, the shift of overlay that is much smaller than that in the embodiment can be measured and thus the accuracy of measurement of the overlay can be improved more than that in the embodiment.

Note that in the first modification, each of the contacts CCL has only to coincide with at least the crossing point CP. In this case, too, in the first modification, a point close to the crossing point CP is used as a reference point of the overlay, with the result that a slight shift of overlay can be detected.

(Second Modification)

Figure 30:
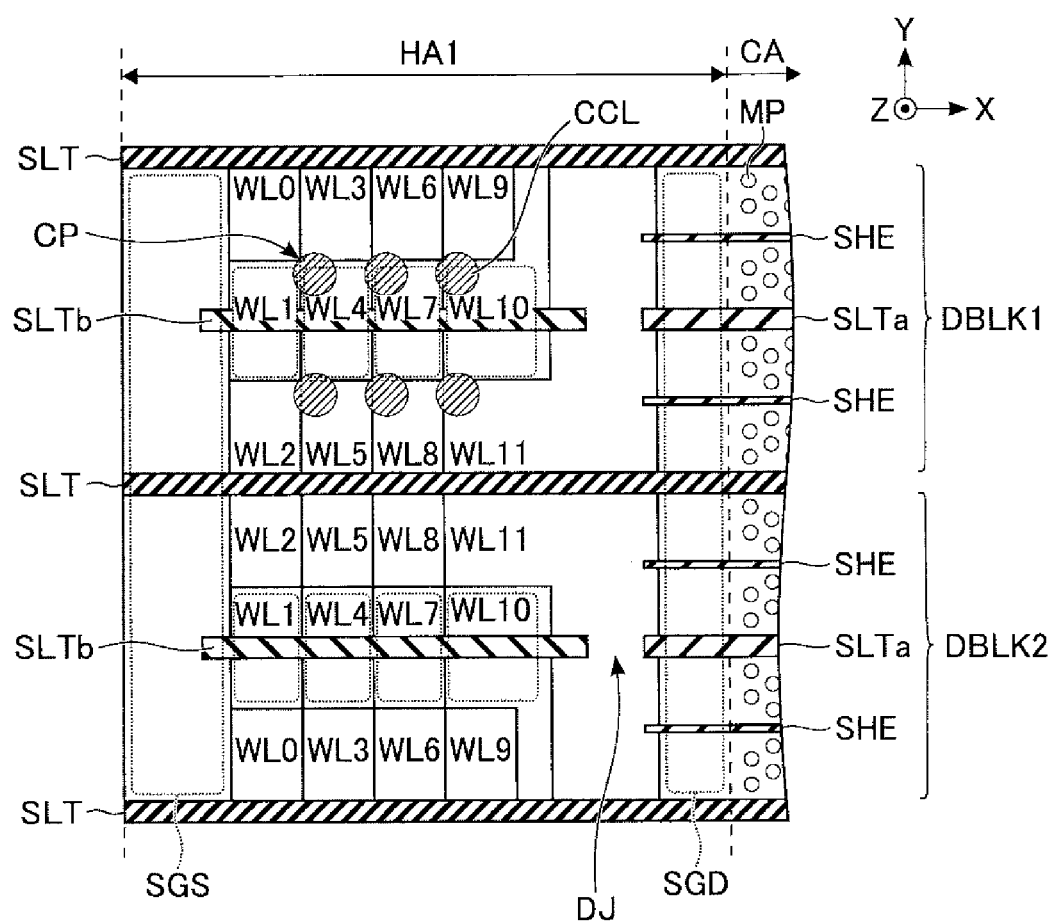
FIG. 30 is a plan view showing an example of a planar layout in a hookup area of a memory cell array included in a semiconductor memory according to a second modification to the embodiment.

FIG. 30 shows an example of a planar layout of the memory cell array 10 in the semiconductor memory 1 according to a second modification to the embodiment. This planar layout differs from that of the memory cell array 10 shown in FIG. 13 in the arrangement of contacts CCL.

As shown in FIG. 30, in the second modification, for example, the planar layout of the memory cell array 10 is so designed that the outer periphery of each of the contacts CCL is in contact with a crossing point CP of the boundary between the stairs.

Specifically, for example, the contacts CCL in the hookup area HA1 are in contact with their respective terraced portions of the conductors 23 corresponding to the word lines WL2, WL4 and WL5. Similarly, the other contacts CCL are in contact with the terraced portions with which the centers of the contacts CCL coincide and two terraced portions adjacent in the X and Y directions to the terraced portions.

Note that in the second modification, the outside diameter of each contact CCL may not necessarily be larger than that of each contact CC. That is, in the second modification, the outside diameter of each contact CCL may be the same as or smaller than that of each contact CC. The other configurations of the semiconductor memory 1 according to the second modification are similar to those of the semiconductor memory 1 according to the embodiment and thus their descriptions will be omitted.

FIG. 31 shows an example of a method of measuring an amount of overlay shift in the second modification to the embodiment and also shows an example of a planar layout of the memory cell array 10 after the contact holes CHL are formed to correspond to the contacts CCL.

As shown in FIG. 31, in the second modification, a layout including a boundary BDY between word lines WL adjacent in the X direction and a boundary BDX between word lines WL adjacent in the Y direction is designed as a reference in an area where the contact holes CHL are formed.

In the second modification, therefore, an amount of overlay shift of the contact holes CHL can be estimated from the results of measurements of an interval XS between the central point and the boundary BDY in the X direction and an interval YS between the central point and the boundary BDX in the Y direction.

As a result, in the manufacturing method of the semiconductor memory 1 according to the second modification, the amount of overlay shift can be estimated from a smaller number of measurement results than that in the embodiment, and the amount of data about the measurements of overlay can be decreased more than that in the embodiment. Like in the first modification, in the second modification, a slight shift of overlay can be detected in the manufacturing method of the semiconductor memory 1 according to the second modification.

Note that in the second modification, each of the contacts CCL need not necessarily be designed such that its outer periphery is in contact with the crossing point CP, but the contacts CCL have only to coincide with at least the boundaries BDX and BDY.

(Third Modification)

FIG. 32 shows an example of a planar layout of the memory cell array 10 included in the semiconductor memory 1 according to a third modification to the embodiment. This planar layout differs from that of the memory cell array 10 shown in FIG. 13 in the arrangement of contacts CCL.

As shown in FIG. 32, in the third modification, each of the contacts CCL is so designed that its plane is shaped like an ellipse extending in, for example, the X direction. The contacts CCL are each arranged so as to overlap, e.g. the boundary between the stairs.

Specifically, for example, the contacts CCL in the hookup area HA1 are in contact with their respective terraced portions of the conductors 23 corresponding to the word lines WL1, WL2, WL4, WL5, WL7, WL8, WL10 and WL11. Similarly, the other contacts CCL are in contact with four terraced portions arranged in the X direction and two terraced portions adjacent in the Y direction to the four terraced portions.

Like in the embodiment, the contact holes CHL are preferably designed to have such a diameter that the conductors can be embedded in the contact holes CHL and flattened in the process of step S13 shown in FIG. 16. The other configurations of the semiconductor memory 1 according to the third modification are similar to those of the semiconductor memory 1 according to the embodiment and thus their descriptions will be omitted.

Figure 33:
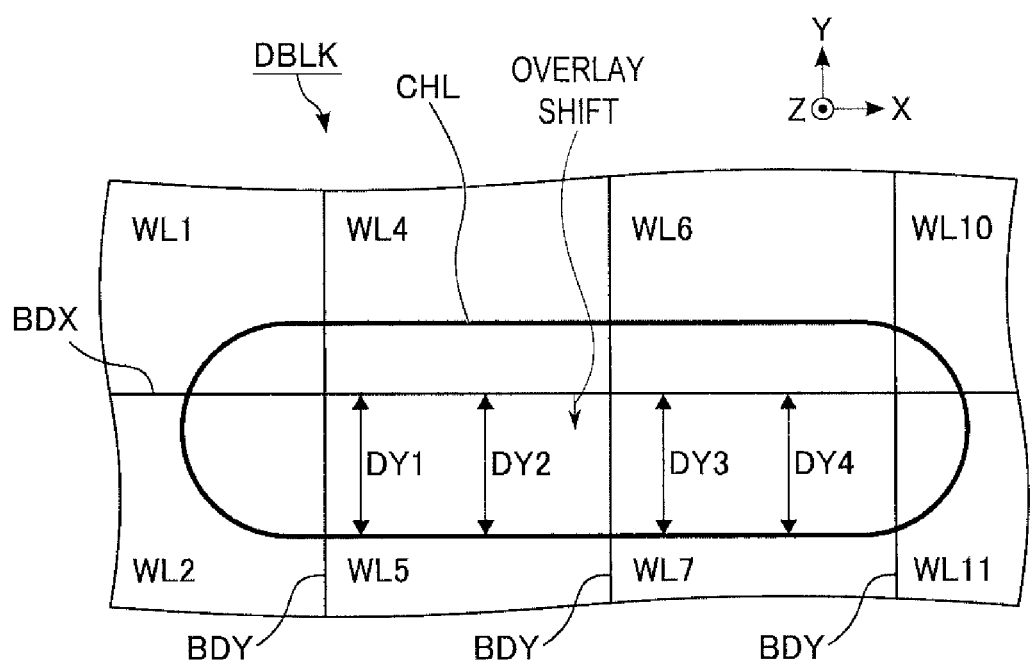
FIG. 33 is a plan view in the hookup area of the memory cell array, showing an example of a method of measuring an amount of overlay shift in the third modification to the embodiment.

FIG. 33 shows an example of a method of measuring an amount of overlay shift in the third modification to the embodiment and also shows an example of a planar layout of the memory cell array 10 after the contact holes CHL are formed to correspond to the contacts CCL.

As shown in FIG. 33, in the third modification, for example, a single boundary BDX and a plurality of boundaries BDY are included in an area where the contact holes CHL are to be formed. When the contact holes CHL extend in the X direction, a plurality of measurement points can be set by measuring the amount of overlay shift.

Specifically, for example, intervals DY1, DY2, DY3 and DY4 between the boundary BDX and the inner peripheries of the contact holes CHL in the minor radius direction of the ellipse are measured. The intervals DY1, DY2, DY3 and DY4 are arranged to shift from one another in the X direction. The number of measurements of the intervals DY is not limited to four but can be set optionally.

In the third modification, the amount of overlay shift is calculated based upon the results of measurements of the intervals DY1, DY2, DY3 and DY4. Since an average value of the results of measurements can be used in the third modification, the results of measurements can be inhibited from varying.

As a result, in the manufacturing method of the semiconductor memory 1 according to the third modification, the amount of overlay shift can be estimated with higher accuracy than in the embodiment. Like in the first modification, in the third modification, a slight shift of overlay can be detected.

In the third modification, the contacts CCL are each shaped like an ellipse extending in the X direction. However, the ellipse may extend in the Y direction. In this case, too, if the contact holes CHL are arranged to include a boundary between the stairs, the amount of overlay shift can be estimated using a plurality of measurement results.

(Fourth Modification)

The contact holes CHL are different in the range of a measurable amount of overlay shift among the embodiment and modifications described above.

For example, the contact holes CHL in the embodiment are valid when the shift amount is large, and a slight shift cannot be detected. The contact holes CHL in the first modification are valid when the shift amount is small, and a large shift cannot be detected.

The contact holes CHL in the second modification are suitable to detect a shift in, for example, the negative direction of the X direction and the positive direction of the Y direction, but a detectable amount of shift in the positive direction of the X direction and the negative direction of the Y direction is reduced. In the contact holes CHL of the third modification, for example, the shift amount in the Y direction can be detected with high accuracy, but the contact holes CHL are not suitable to detect the shift amount in the X direction.

Therefore, in the semiconductor memory 1 according to the fourth modification of the embodiment, the foregoing contact holes CHL in the embodiment and the first to third modifications are used in combination.

Figure 34:
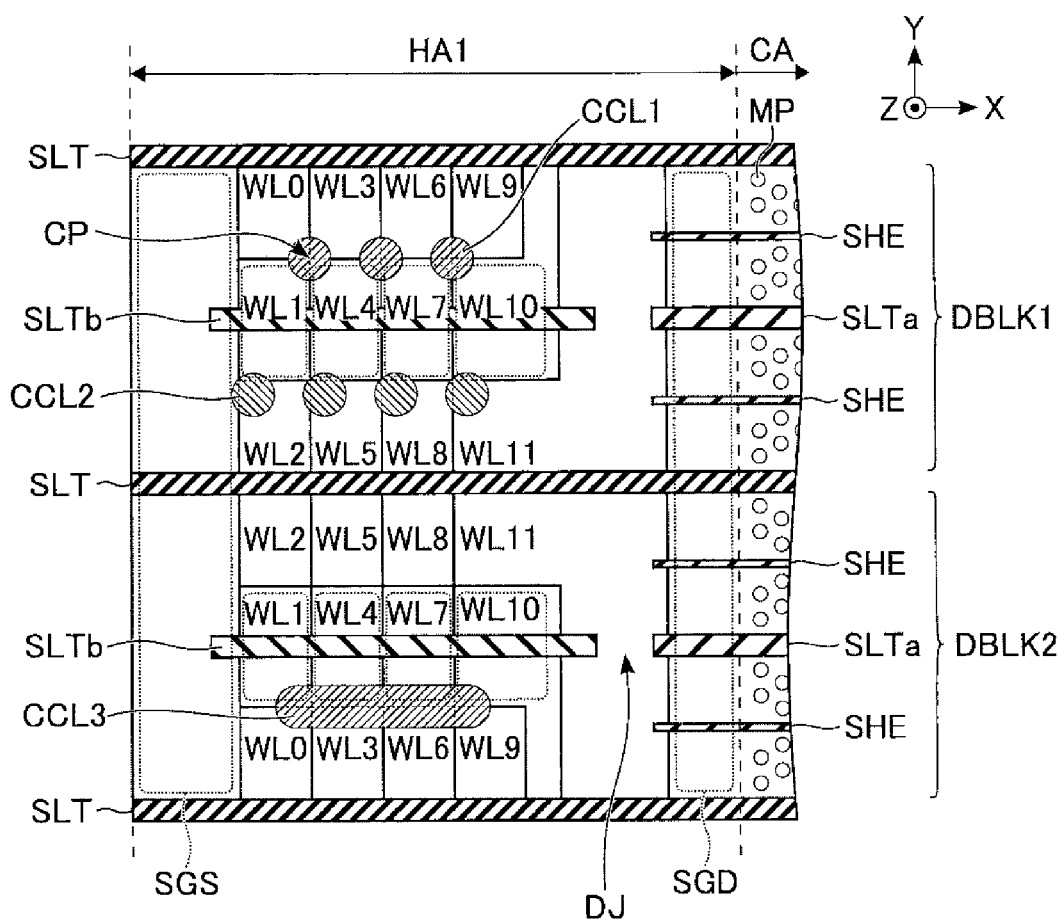
FIG. 34 is a plan view showing an example of a planar layout in a hookup area of a memory cell array included in a semiconductor memory according to a fourth modification to the embodiment.

FIG. 34 shows an example of a planar layout of the memory cell array 10 in the semiconductor memory 1 according to the fourth modification to the embodiment. This planar layout differs from that of the memory cell array 10 shown in FIG. 13 in the arrangement and type of contacts CCL.

As shown in FIG. 34, the memory cell array 10 in the fourth modification includes the contact CCL1 according to the first modification, the contact CCL2 according to the second modification and the contact CCL3 according to the third modification.

The contacts CCL (contact holes CHL) in the embodiment and modifications described above may be arranged in combination. In the manufacturing method of the semiconductor memory 1 in the fourth modification, the amount of overlay shift can be measured with higher accuracy. The combination of the contacts CCL is not limited to that shown in FIG. 34, but they can be combined optionally.

(Fifth Modification)

In the semiconductor memory 1 according to the embodiment described above, between the block group BLKG and BL connection area BLtap, another area may be placed.

Figure 35:
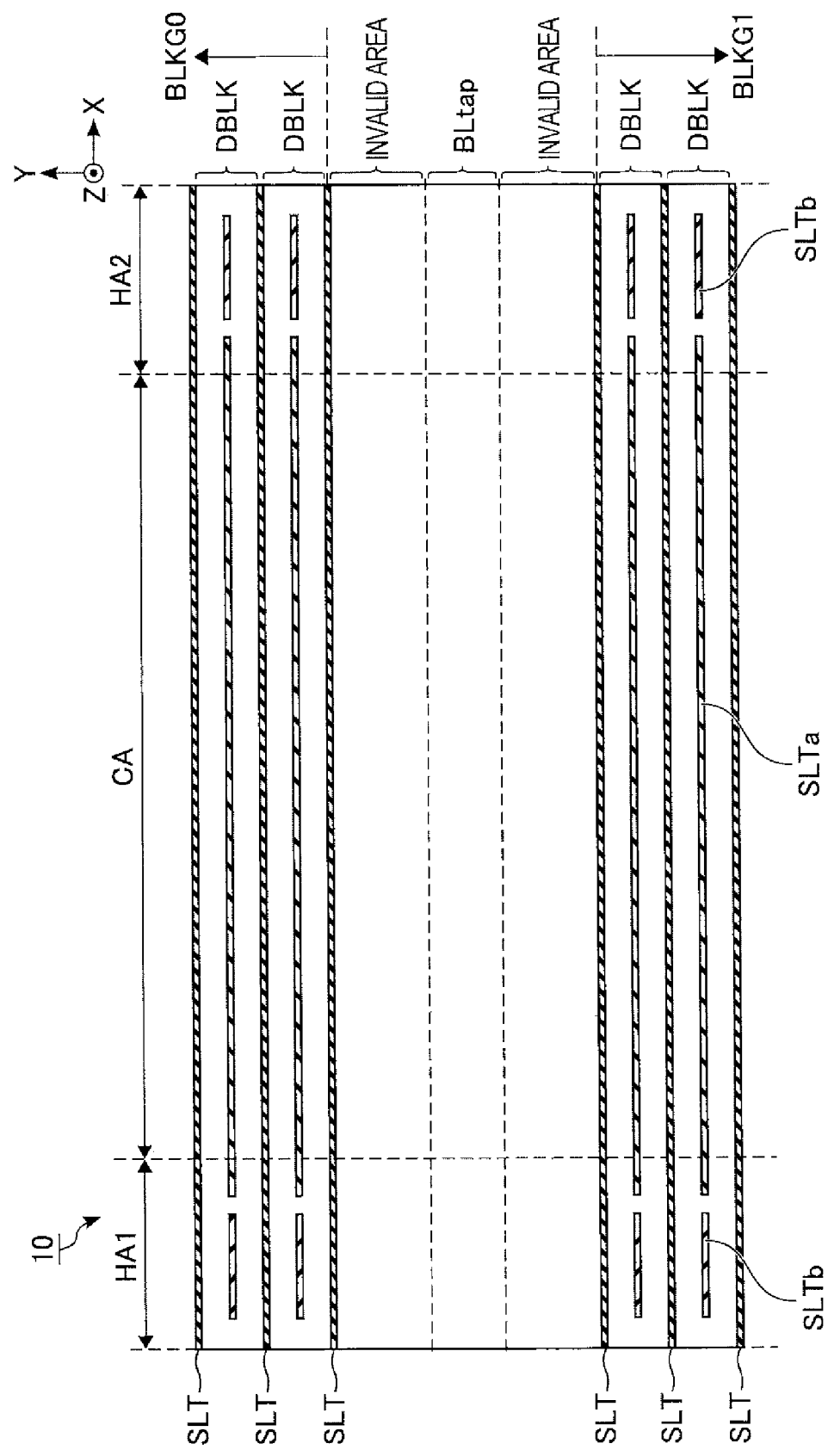
FIG. 35 is a plan view showing an example of a planar layout of a memory cell array included in a semiconductor memory according to a fifth modification to the embodiment.

FIG. 35 shows an example of a planar layout of the memory cell array 10 included in the semiconductor memory 1 according to a fifth modification to the embodiment, extracting an area close to the BL connection area BLtap between the block group BLKG0 and BLKG1.

As shown in FIG. 35, an invalid area is placed between the dummy block DBLK disposed at an end portion of each block group BLKG and the BL connection area BLtap adjacent to the block group BLKG. In other words, the BL connection area BLtap is placed, for example, between an invalid area adjacent to the block group BLKG0 and an invalid area adjacent to the block group BLKG1.

The invalid area does not include, for example, slits SLT, SLTa, SLTb and SHE. Like the active block ABLK and dummy block DBLK, a word line WL can be replaced in the vicinity of a slit SLT provided between the dummy block DBLK and the invalid area. In the invalid area, in an area where a word line WL can be replaced, a memory pillar MP that is not used for data storage may be disposed.

In the BL connection area BLtap, for example, no word line WL is replaced; thus, a sacrificial member (e.g. nitride film) which has not been replaced with a word line WL may be left. That is, for example, a stacked configuration of an oxide film and a nitride film is formed in the BL connection area BLtap. In this case, a contact for electrically connecting the bit line BL and the sense amplifier module 16 under the memory cell array 10 penetrates the stacked configuration of an oxide film and a nitride film.

Figure 36:
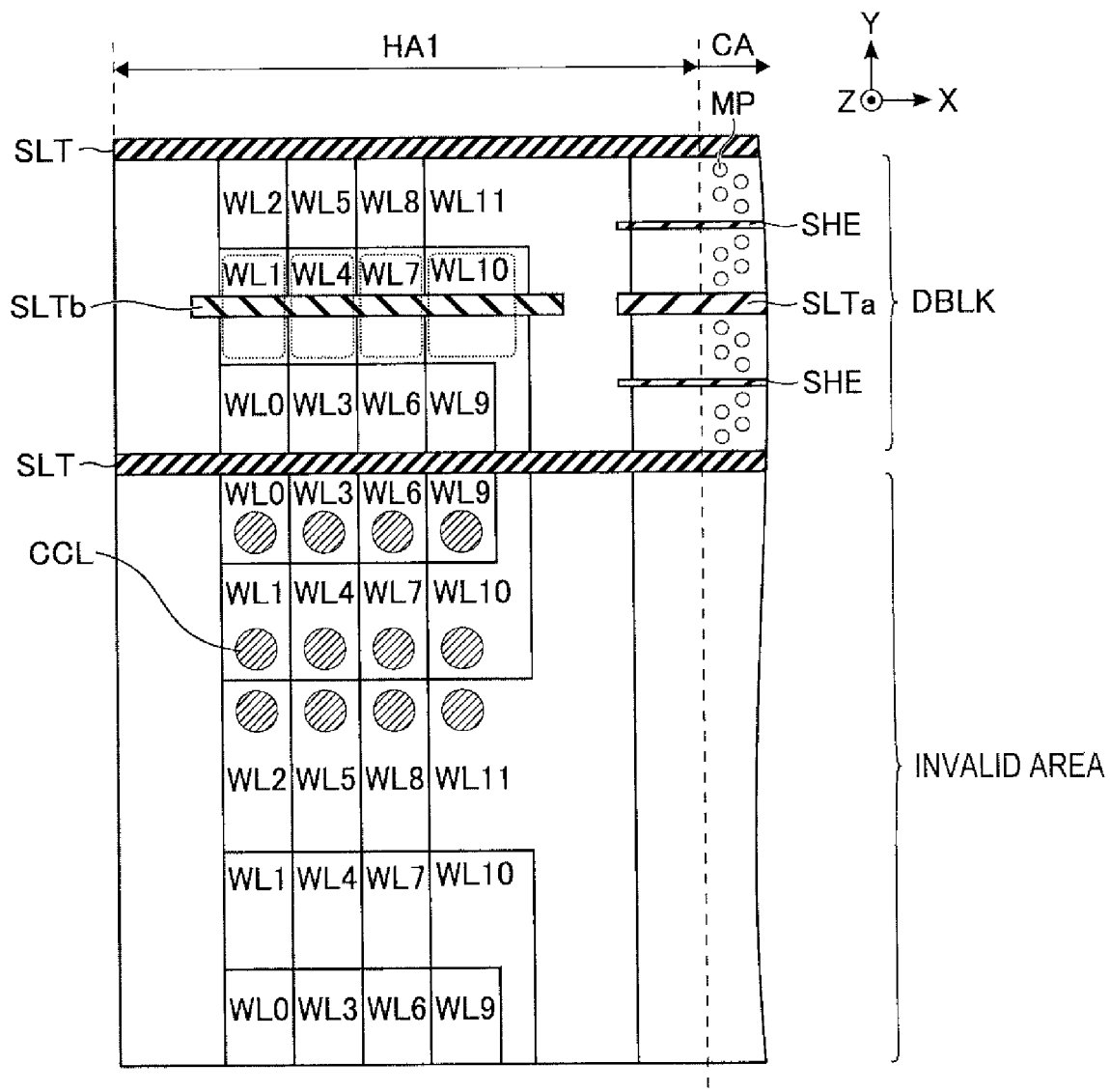
FIG. 36 is a plan view showing an example of a planar layout in a hookup area of the memory cell array included in the semiconductor memory according to the fifth modification to the embodiment.

FIG. 36 shows an example of a planar layout of the memory cell array 10 included in the semiconductor memory 1 according to the fifth modification to the embodiment, extracting a dummy block DBLK and its adjacent invalid area.

As shown in FIG. 36, the planar layout of the invalid area in the hookup area HA1 is designed in the same manner as, for example, a planar layout in which slits SLT, SLTa, SLTb and SHE are excluded from the dummy block DBLK. The invalid area in the hookup area HA1 may have a staircase configuration of word lines WL similar to the dummy block DBLK.

In the semiconductor memory 1 according to the fifth modification to the embodiment, contacts CCL are arranged on the stair portions of the word lines WL formed in the invalid area. The contacts CCL in the fifth modification are arranged in an area where the word line WL is replaced, that is, an area where the conductors 23 are formed. Also, a method of arranging the contacts CCL within the invalid area in the fifth modification can be applied to all of the embodiment and first to fourth modifications described above.

Thus, in the semiconductor memory 1 according to the fifth modification, the use of the contact holes CHL formed in the invalid area during the manufacture makes it possible to evaluate the incline of the boundary between the stairs as in the embodiment and bring about the same advantage as that of the embodiment.

As described above, the contacts CCL of the above embodiment and modifications may not necessarily be arranged in the dummy block DBLK. The contacts CCL have only to be arranged in at least the dummy block DBLK or the invalid area and also may be arranged in both the dummy block DBLK and the invalid area.

[2] Other Modifications

A semiconductor memory according to an embodiment includes first and second areas, an active region, a non-active region, a first stacked body, a plurality of first pillars, a first contact, a second stacked body, and a second contact. The first and second areas are arranged in a first direction. The active region includes part of each of the first and second areas. The non-active region includes part of each of the first and second areas. The first stacked body is in the active region. The first stacked body includes first insulators and first conductors which are alternately stacked. Each of the first conductors includes a terraced portion that does not overlap the upper first conductor in the second area. The plurality of first pillars each penetrates the first stacked body in the first area. The intersection between the first pillar and the first conductor functions as a memory cell. The first contact is provided on a terraced portion of a first conductor in a first interconnect layer. The second stacked body is in the non-active region. The second stacked body includes second insulators and second conductors which are alternately stacked. Each of the second conductors includes a terraced portion that does not overlap the upper second conductor in the second area. The second contact is in contact with a second conductor in the first interconnect layer and a second conductor in a second interconnect layer different from the first interconnect layer. The semiconductor memory according to the embodiment can thus be improved in its yield.

The embodiment has been described by focusing attention on the amount of overlay shift of the contact holes CHL. In the process of step S12, however, a parameter other than the shift amount may be calculated. For example, measurement is carried out for each of the contact holes CHL to calculate numerical values regarding the overlay, such as magnification and rotation. In the embodiment, the number of measurement points can be increased as appropriate and the number of types of parameters used for the correction can be increased to feed back a more appropriate correction value.

In the embodiment, a scanning electron microscope (SEM) is used to measure the bottoms of the contact holes CHL. In the process of step S12 described with reference to FIG. 16 in the embodiment, however, the bottoms of the contact holes CHL may be measured using other measuring devices, and a device capable of measuring them at least non-destructively has only to be selected.

The embodiment has been described by focusing attention on the shift of overlay of the contacts CC and CCL in the stairs of the word lines WL. However, the configuration of the contacts used for measurement of overlay, such as the contact holes CHL, can also be applied to a process in which the other contacts are formed.

In the embodiment, the end portions of the word lines WL in the hookup area HA are formed stepwise in three lines.

However, the end portions of the word lines WL may have a staircase configuration of, for example, two lines or four or more lines.

In the embodiment, the even-numbered blocks BLK and the odd-numbered blocks BLK are different in the direction in which a voltage is applied to the active blocks ABLK arranged in the Y direction. For example, the hookup area HA may be provided on only one side of the cell area CA in the X direction. In this case, the voltage is applied to the stacked interconnect corresponding to the active blocks ABLK in the block group BLKG from the same direction.

In the embodiment, a voltage is applied to the stacked interconnect of the word lines WL, etc. from one side in the X direction. For example, the contacts CC can be provided in each of the hookup areas HA1 and HA2 in an active block ABLK and a voltage may be applied to the word lines WL, etc. from both sides in the X direction.

The memory pillar MP may be so configured that a plurality of pillars are connected in the Z direction. For example, the memory pillar MP may be so configured that a pillar penetrating the conductor 24 (select gate line SGD) and a pillar penetrating a plurality of conductors 23 (word lines WL) are connected. The memory pillar MP may also be so configured that a plurality of pillars penetrating their respective conductors 23 are connected in the Z direction.

In the embodiment, though the slits SLT and SLTa are configured to divide the conductor 24, they need not divide the conductor 24. In this case, the memory pillar MP is so configured that a plurality of pillars are connected in the Z direction. For example, the lower pillar penetrates the conductors 22 and 23 and the upper pillar penetrates the conductor 24. The conductor 24 is divided by, for example, a slit other than the slits SLT and SLTa and, each of the conductors into which the conductor 24 is divided functions as a select gate line SGD.

In the semiconductor memory 1 according to the embodiment, the conductors 23 and 24 can be formed by performing a replacement process using, for example, the slits SLT SLTa and SLTb. In this case, a plurality of support pillars each formed of an insulator and penetrating a stacked configuration in which the conductors 23 and 24 are formed, can be formed between, for example, adjacent slits SLT and SLTb. The contacts CCL of the embodiment may or may not overlap the support pillars. When the contacts CCL overlap the support pillars, they may include a portion that passes the conductor 23 through the area where the support pillars are formed.

In the embodiment, the semiconductor memory 1 has a configuration in which a circuit such as the sense amplifier module 16 is provided under the memory cell array 10. However, for example, the semiconductor memory 1 may have a configuration in which the memory cell array 10 and the sense amplifier module 16 are formed on the semiconductor substrate 20. In this case, for example, the memory pillar MP may be so configured that the semiconductor 31 and the source line SL are electrically connected through the bottom of the memory pillar MP.

The memory cell array 10 may have other configurations, which are disclosed in, for example, U.S. patent application Ser. No. 12/407,403 filed on Mar. 19, 2009 and entitled "THREE-DIMENSIONALLY STACKED NON-VOLATILE SEMICONDUCTOR MEMORY," U.S. patent application Ser. No. 12/406,524 filed on Mar. 18, 2009 and entitled "THREE-DIMENSIONALLY STACKED NON-VOLATILE SEMICONDUCTOR MEMORY," U.S. patent application Ser. No. 12/679,991 filed on Mar. 25, 2010 and entitled "NON-VOLATILE SEMICONDUCTOR MEMORY DEVICE AND MANUFACTURING METHOD THEREOF" and U.S. patent application Ser. No. 12/532,030 filed on Mar. 23, 2009 and entitled "SEMICONDUCTOR MEMORY AND MANUFACTURING METHOD THEREOF." All the patent applications are incorporated in the present specification by reference.

The term "connected" used in the present specification indicates "electrical connection" and does not exclude, for example, another element through which the electrical connection is made.

While certain embodiments have been described, these embodiments have been presented by the way of example only, and are not Intended to limit the scope of the inventions. Indeed, the novel embodiments described herein may embodied in a variety of other forms; Furthermore, various omissions, substitutions and changes in the form of the embodiments described herein may be made with Out departing from the spirit of the inventions. The accompanying claims and their equivalents are intended to cover such forms or modifications as would fall within the scope and spirit of the inventions.

The invention claimed is:

1. A semiconductor memory device comprising:
a substrate including an active block area and a dummy block area arranged in a first direction;
a plurality of first conductive layers stacked above the substrate and spaced apart from each other, the first conductive layers being disposed in the active block area and in the dummy block area;
a plurality of insulating members extending in a second direction intersecting both the first direction and a stacking direction of the first conductive layers on both sides of the dummy block area in the first direction, the insulating members being arranged above the substrate and partitioning the first conductive layers in the first direction;
a plurality of first pillars extending in the stacking direction through the first conductive layers in the active block area, intersections of the first pillars with at least one of the first conductive layers functioning as memory cells; and
a plurality of second pillars extending in the stacking direction through the first conductive layers in the dummy block area, wherein
the substrate further includes an interconnect connection area in which a first contact electrically connecting an upper interconnect above the first conductive layers and a circuit disposed under the first conductive layers is provided, the dummy block area being disposed between the active block area and the interconnect connection area,
the insulating members include a first insulating member on a first side of the dummy block area facing the active block area and a second insulating member on a second side of the dummy block area facing the interconnect connection area, the first conductive layers being further disposed in an adjacent area close to the second insulating member on an opposite side of the dummy block area,
the dummy block area is sandwiched in the first direction by the first insulating member and the second insulating member,
the first conductive layers are stacked with a plurality of first insulating layers alternately in the stacking direction in the active block area, in the dummy block area, and in the adjacent area, the first insulating layers being partitioned by the insulating members in the first direction, and the first insulating layers and a plurality of second insulating layers are alternately stacked in the stacking direction in the interconnect connection area, the first contact extending in the stacking direction through the first insulating layers and the second insulating layers in the interconnect connection area.

2. The device of claim 1, further comprising:
a plurality of third pillars extending in the stacking direction through the first conductive layers in the adjacent area.

3. The device of claim 1, wherein
at least one of the first pillars is electrically connected to the upper interconnect.

4. The device of claim 1, further comprising:
a second contact provided in the dummy block area, no upper interconnect being coupled to the second contact.

5. The device of claim 1, wherein
each of the first insulating layers includes an oxide film and each of the second insulating layers includes a nitride film.

6. The device of claim 1, wherein
the second insulating layers in the interconnect connection area are in contact with the first conductive layers in the adjacent area.

7. The device of claim 1, wherein
the insulating members are provided on both sides of the active block area in the first direction,
a width of the dummy block area in the first direction is approximately equal to a width of the active block area in the second direction.

8. The device of claim 7, wherein
a width of the adjacent area in the first direction differs from the width of the dummy block area in the first direction and the width of the active block area in the second direction.

9. The device of claim 1, wherein
a pitch of the second pillars in the dummy block area in the first direction is approximately equal to a pitch of the first pillars in the active block area in the first direction.

10. The device of claim 1, wherein
the second pillars in the dummy block area have a same structure as the first pillars in the active block area.

11. A semiconductor memory device comprising:
a substrate including first and second active block areas and first and second dummy block areas arranged in a first direction;
a plurality of first conductive layers stacked above the substrate and spaced apart from each other, the first conductive layers being disposed in the first and second active block areas and in the first and second dummy block areas;
a plurality of insulating members extending in a second direction intersecting both the first direction and a stacking direction of the first conductive layers on both sides of the first dummy block area in the first direction and on both sides of the second dummy block area in the first direction, the insulating members being arranged above the substrate and partitioning the first conductive layers in the first direction;
a plurality of first pillars extending in the stacking direction through the first conductive layers in the first active block area, intersections of the first pillars with at least one of the first conductive layers functioning as memory cells; and a plurality of second pillars extending in the stacking direction through the first conductive layers in the first dummy block area, wherein the substrate further includes an interconnect connection area in which a first contact electrically connecting an upper interconnect above the first conductive layers and a circuit disposed under the first conductive layers is provided, the first dummy block area being disposed between the first active block area and the interconnect connection area in the first direction, the second dummy block area being disposed between the second active block area and the interconnect connection area in the first direction, and the interconnect connection area being disposed between the first dummy block area and the second dummy block area in the first direction, and the insulating members include a first insulating member on a first side of the first dummy block area facing the first active block area and a second insulating member on a second side of the first dummy block area facing the interconnect connection area, the first conductive layers being further disposed in a first adjacent area close to the second insulating member on an opposite side of the first dummy block area.

12. The device of claim 11, further comprising:
a plurality of third pillars extending in the stacking direction through the first conductive layers in the first adjacent area.

13. The device of claim 11, further comprising:
a plurality of fourth pillars extending in the stacking direction through the first conductive layers in the second active block area, intersections of the fourth pillars with at least one of the first conductive layers functioning as memory cells; and
a plurality of fifth pillars extending in the stacking direction through the first conductive layers in the second dummy block area.

14. The device of claim 13, wherein
the insulating members further include a third insulating member on a first side of the second dummy block area facing the second active block area and a fourth insulating member on a second side of the second dummy block area facing the interconnect connection area, the first conductive layers being further disposed in a second adjacent area close to the fourth insulating member on an opposite side of the second dummy block area.

15. The device of claim 14, wherein
the first conductive layers are stacked with a plurality of first insulating layers alternately in the stacking direction in the first and second active block areas, in the first and second dummy block areas, and in the first and second adjacent areas, the first insulating layers being partitioned by the insulating members in the first direction, and the first insulating layers and a plurality of second insulating layers are alternately stacked in the stacking direction in the interconnect connection area, the first contact extending in the stacking direction through the first insulating layers and the second insulating layers in the interconnect connection area.

16. The device of claim 15, wherein
each of the first insulating layers includes an oxide film and each of the second insulating layers includes a nitride film.
17. The device of claim 15, wherein
the second insulating layers in the interconnect connection area are in contact with the first conductive layers in the first adjacent area and the first conductive layers in the second adjacent area.
18. The device of claim 11, wherein
the second pillars in the first dummy block area have a same structure as the first pillars in the first active block area.
19. The device of claim 13, wherein
the second pillars in the first dummy block area and the fifth pillars in the second dummy block area have a same structure as the first pillars in the first active block area and the fourth pillars in the second active block area.

* * * * *